(12) United States Patent
Shibata

(10) Patent No.: US 11,481,266 B2
(45) Date of Patent: Oct. 25, 2022

(54) DIAGNOSING AN INFORMATION PROCESSING SYSTEM MALFUNCTION VIA DIAGNOSTIC MODELING

(71) Applicant: CANON KABUSHIKI KAISHA, Tokyo (JP)

(72) Inventor: Daisuke Shibata, Toride (JP)

(73) Assignee: Canon Kabushiki Kaisha, Tokyo (JP)

(\*) Notice: Subject to any disclaimer, the term of this patent is extended or adjusted under 35 U.S.C. 154(b) by 0 days.

(21) Appl. No.: 16/759,819

(22) PCT Filed: May 29, 2019

(86) PCT No.: PCT/JP2019/021354
§ 371 (c)(1),
(2) Date: Apr. 28, 2020

(87) PCT Pub. No.: WO2019/230824
PCT Pub. Date: Dec. 5, 2019

(65) Prior Publication Data
US 2020/0310934 A1 Oct. 1, 2020

(30) Foreign Application Priority Data

May 30, 2018 (JP) .............................. JP2018-103669
May 8, 2019 (JP) .............................. JP2019-088575

(51) Int. Cl.
*G06F 11/07* (2006.01)
(52) U.S. Cl.
CPC ........ *G06F 11/079* (2013.01); *G06F 11/0733* (2013.01)
(58) Field of Classification Search
CPC ................ G06F 11/0733; G06F 11/079
See application file for complete search history.

(56) References Cited

U.S. PATENT DOCUMENTS 7,698,605 B2\* 4/2010 Wachi ................. G06F 11/2294
714/48
7,865,089 B2\* 1/2011 Andreoli ............. G06F 11/0748
399/8
(Continued)

FOREIGN PATENT DOCUMENTS

JP 2008017269 A 1/2008

OTHER PUBLICATIONS

International Search Report and Written Opinion issued in corresponding parent International Application No. PCT/JP2019/021354 dated Aug. 19, 2019.

*Primary Examiner* — Joseph R Kudirka
(74) *Attorney, Agent, or Firm* — Venable LLP

(57) ABSTRACT

A server apparatus collects, from a plurality of information processing apparatuses, time series information indicating a change over time in settings and a state of each information processing apparatus, and error information indicating an error that has occurred in each information processing apparatus, generates learning data including the collected information, and generates a diagnostic model, which is a trained model for a malfunction diagnosis in the information processing apparatus, through learning based on the generated learning data. The information processing apparatus obtains the diagnostic model from the server apparatus, outputs a diagnosis result indicating a likelihood that an error will occur in the information processing apparatus by collecting information necessary for the malfunction diagnosis within the information processing apparatus and executing the malfunction diagnosis using the collected information and the obtained diagnostic model.

20 Claims, 15 Drawing Sheets

(56) References Cited

U.S. PATENT DOCUMENTS

| | | | |
|---|---|---|---|
| 8,132,049 B2* | 3/2012 | Yasukawa | G03G 15/5079 |
| | | | 714/26 |
| 9,628,340 B2* | 4/2017 | Blair | H04L 41/142 |
| 2009/0217099 A1 | 8/2009 | Kato | |
| 2016/0378584 A1 | 12/2016 | Oku et al. | |
| 2017/0278007 A1* | 9/2017 | Anchuri | G06F 11/008 |
| 2018/0032387 A1 | 2/2018 | Hiran et al. | |
| 2019/0087249 A1* | 3/2019 | Togawa | H04N 1/00323 |
| 2019/0129823 A1* | 5/2019 | Pell | G06F 11/079 |

* cited by examiner

[Fig. 1]
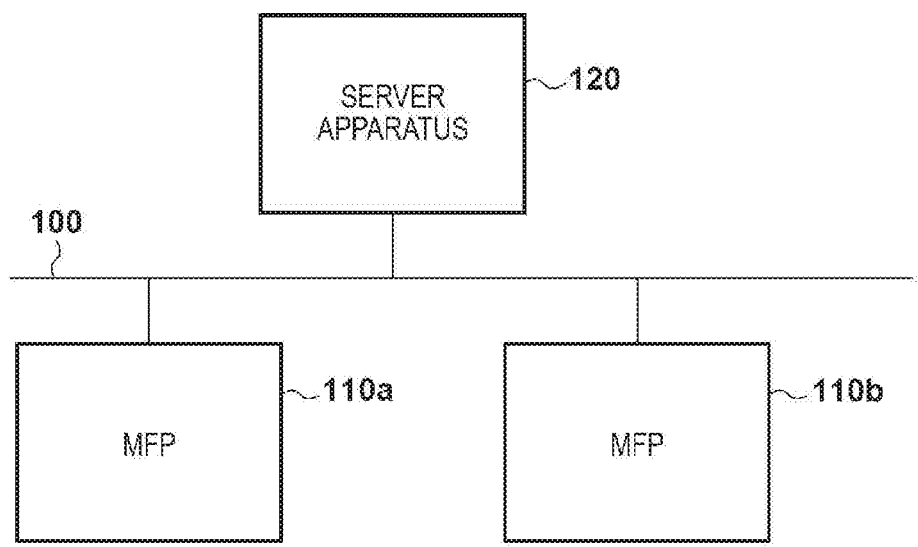
[Fig. 2]
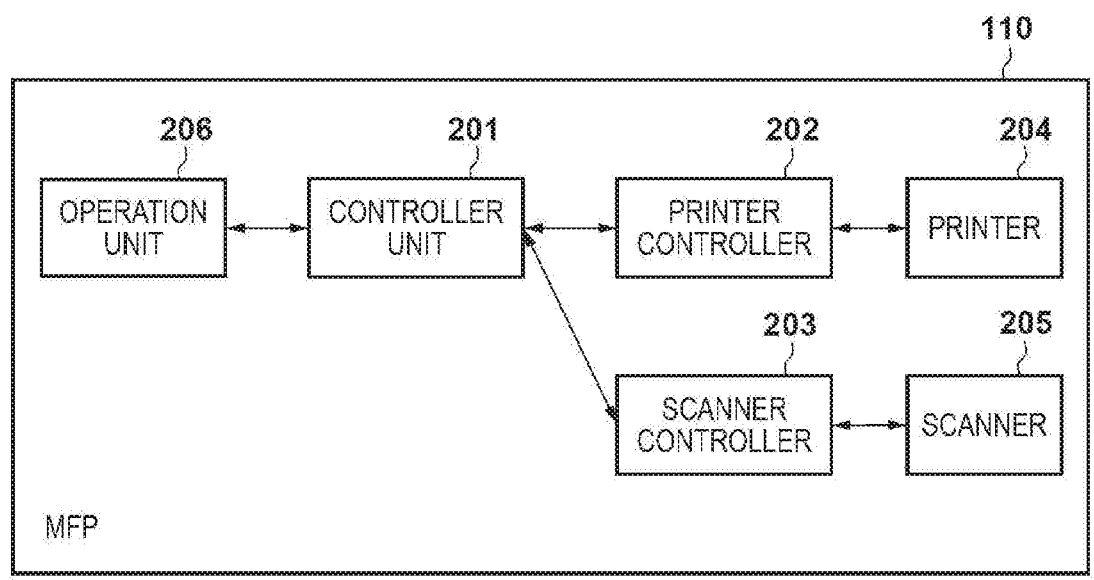

[Fig. 3]
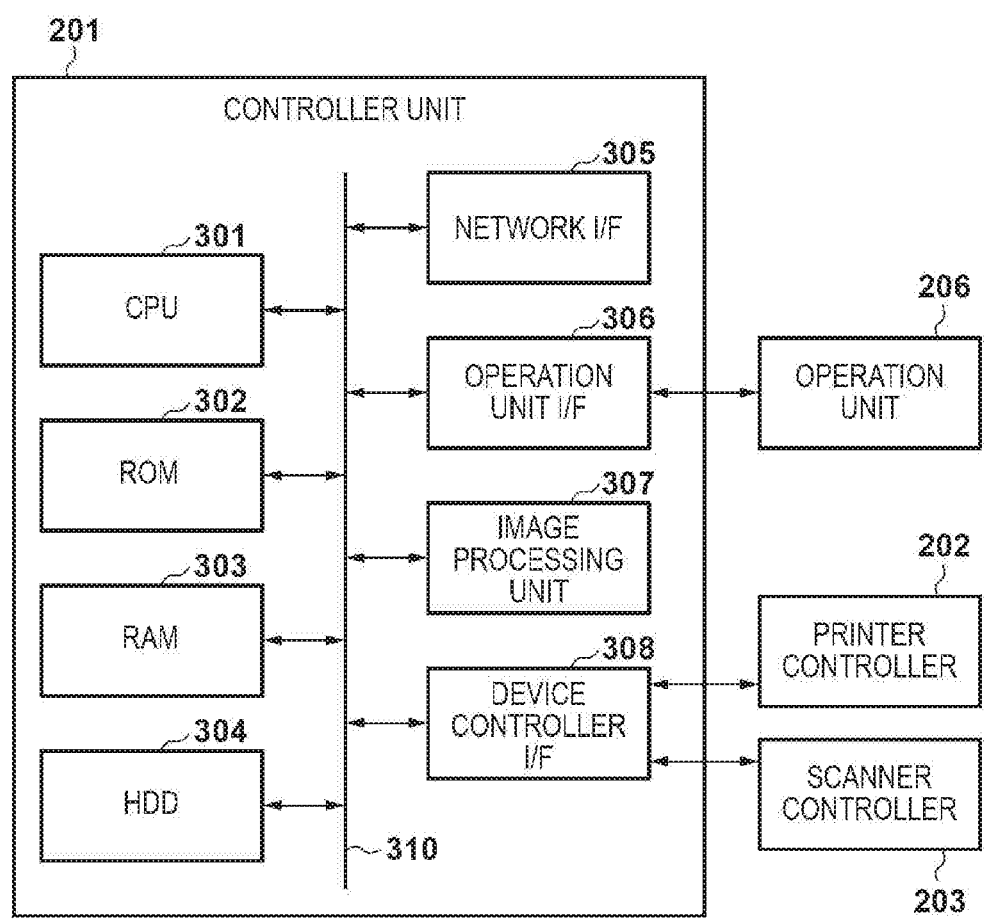

[Fig. 4]
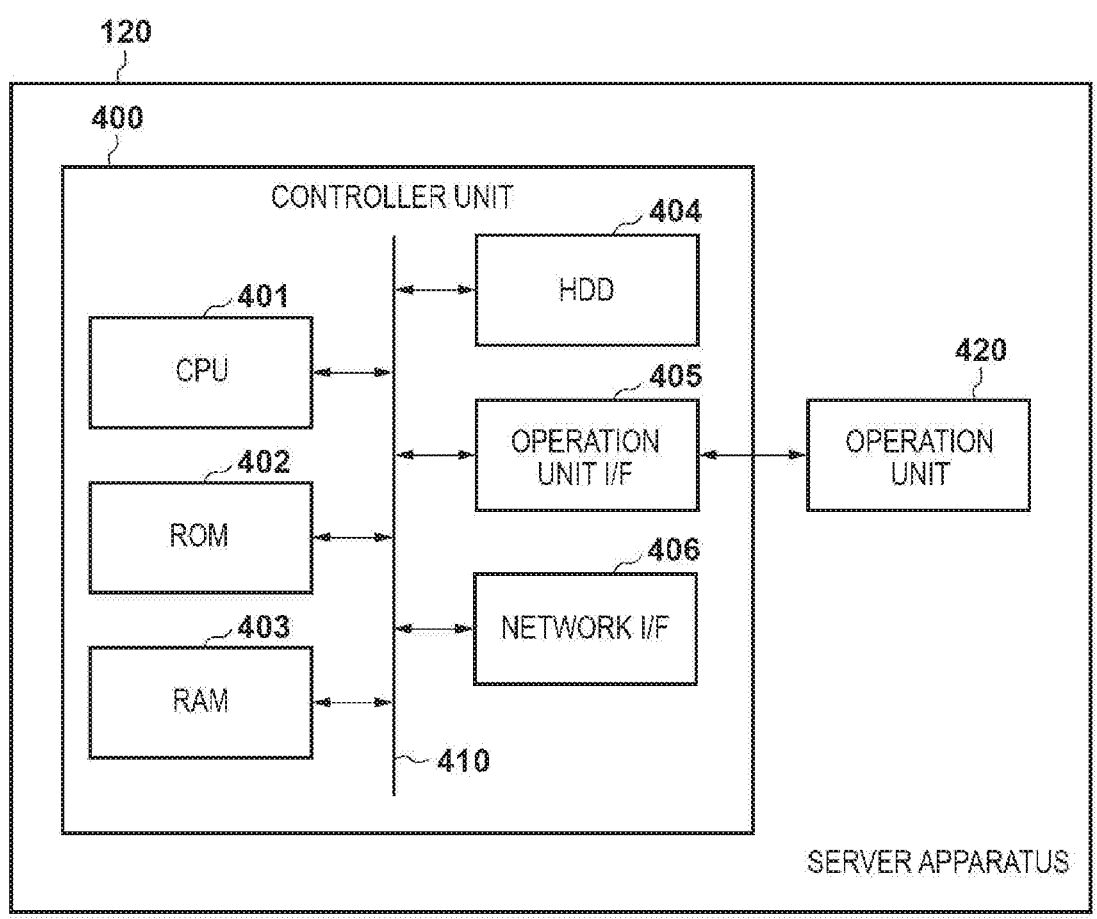

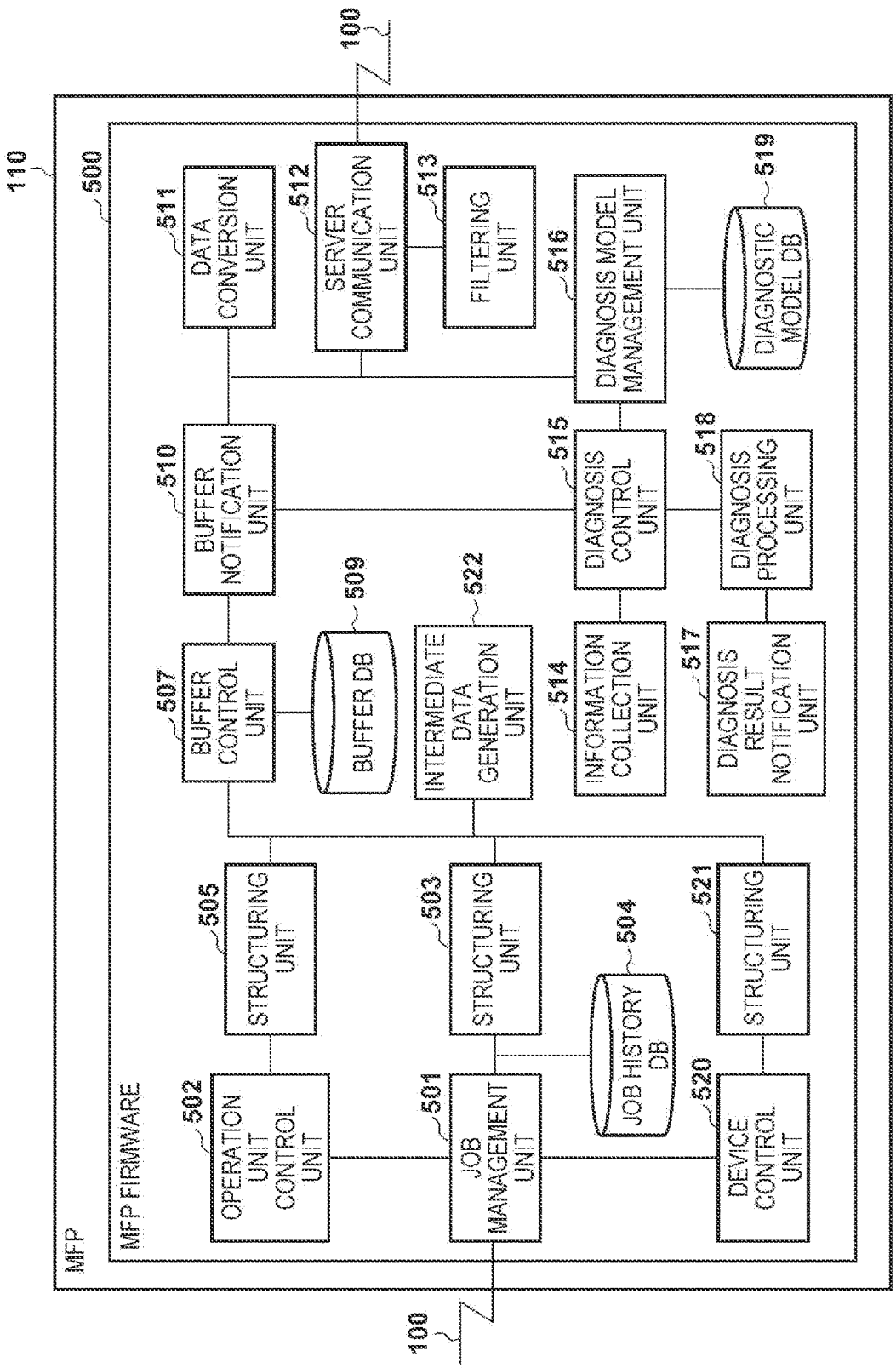
[Fig. 5]

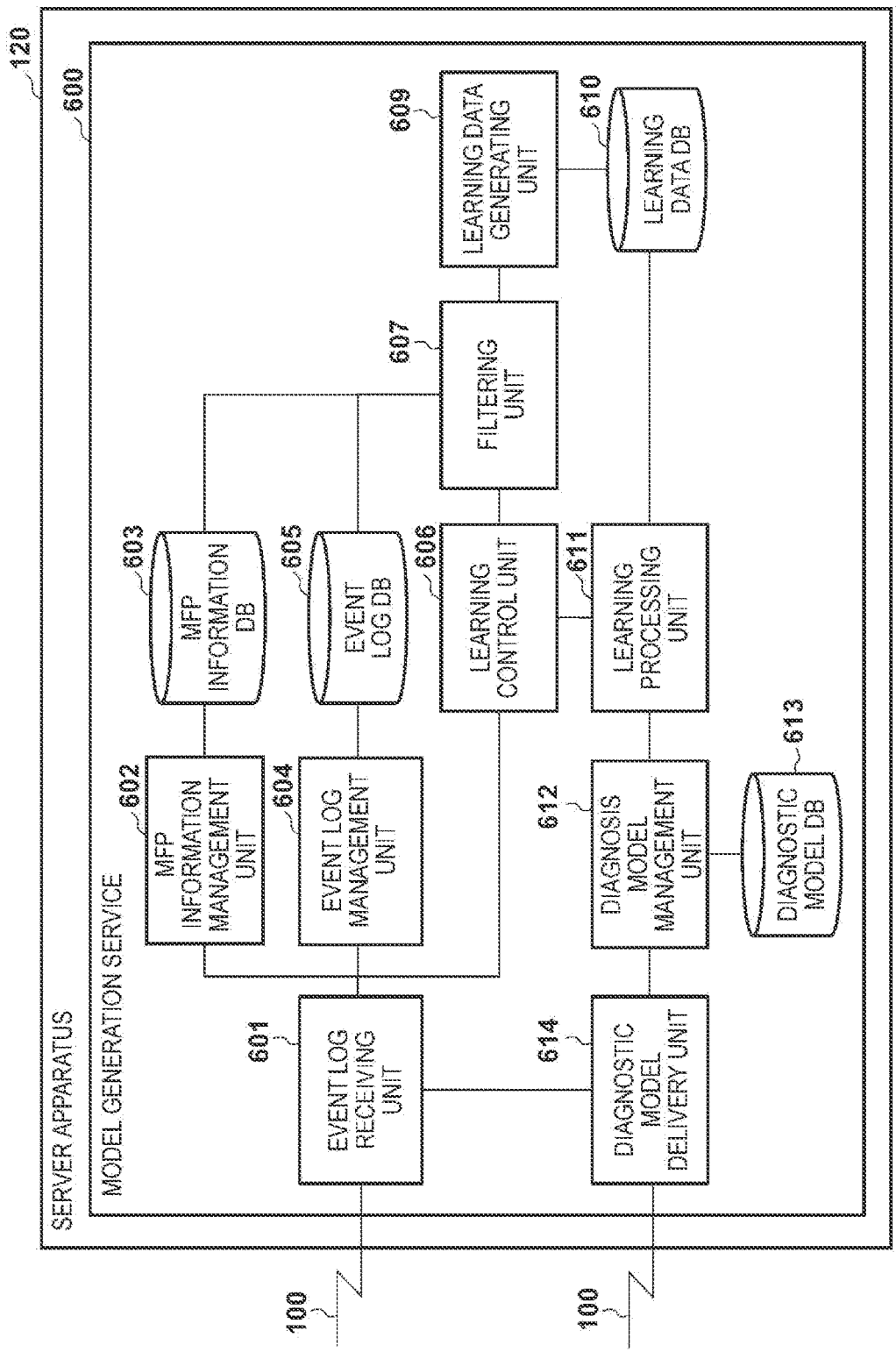
[Fig. 6]

[Fig. 7]
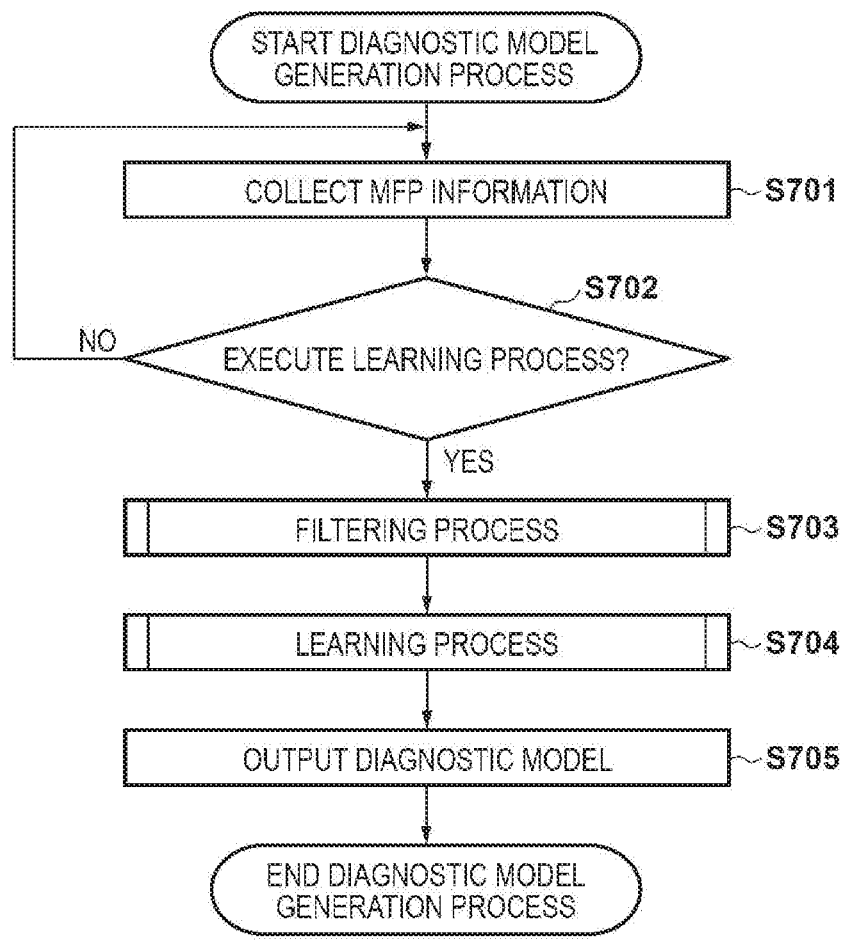

[Fig. 8]
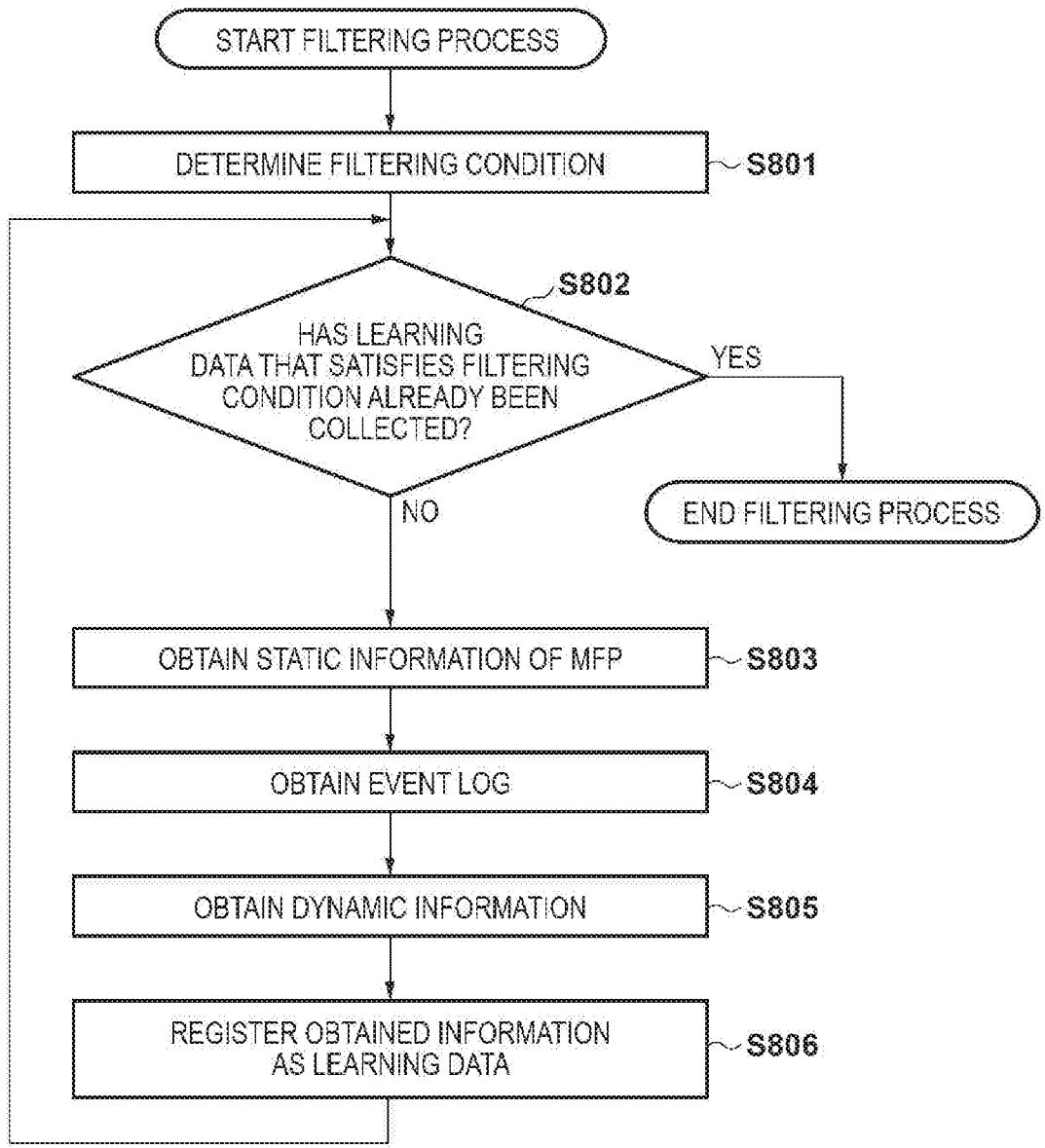

[Fig. 9]
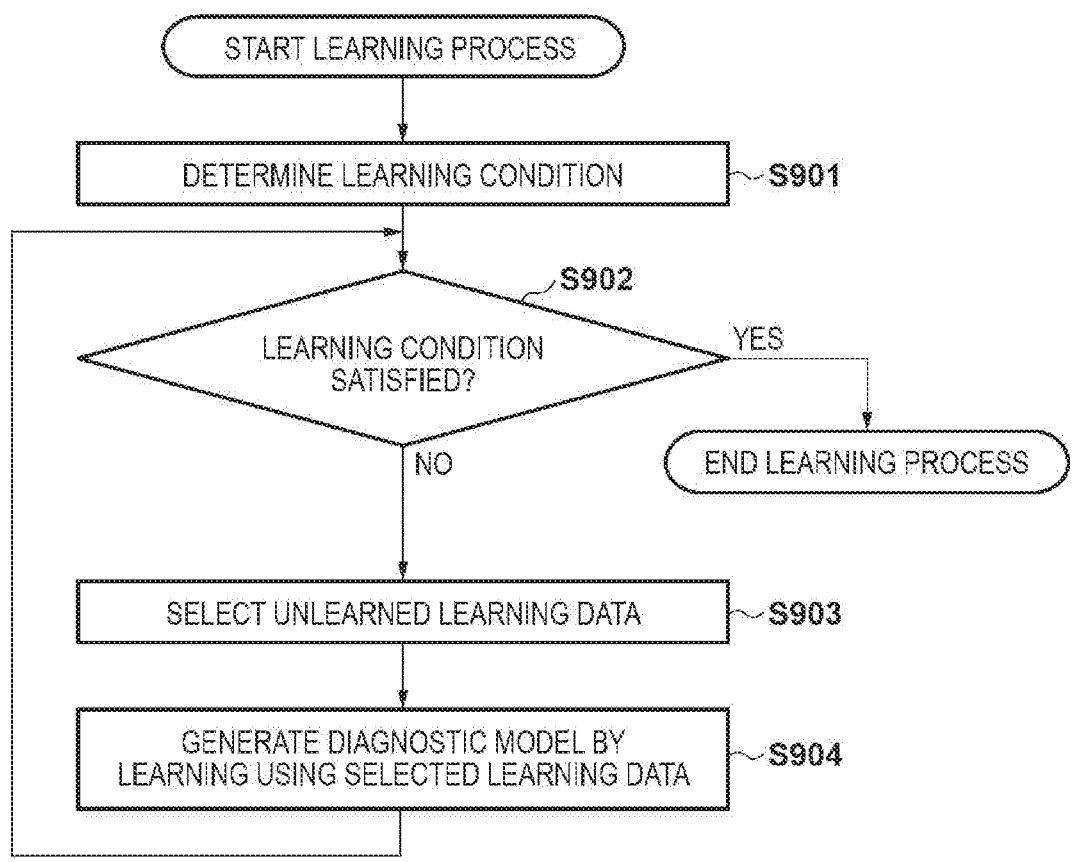

[Fig. 10]
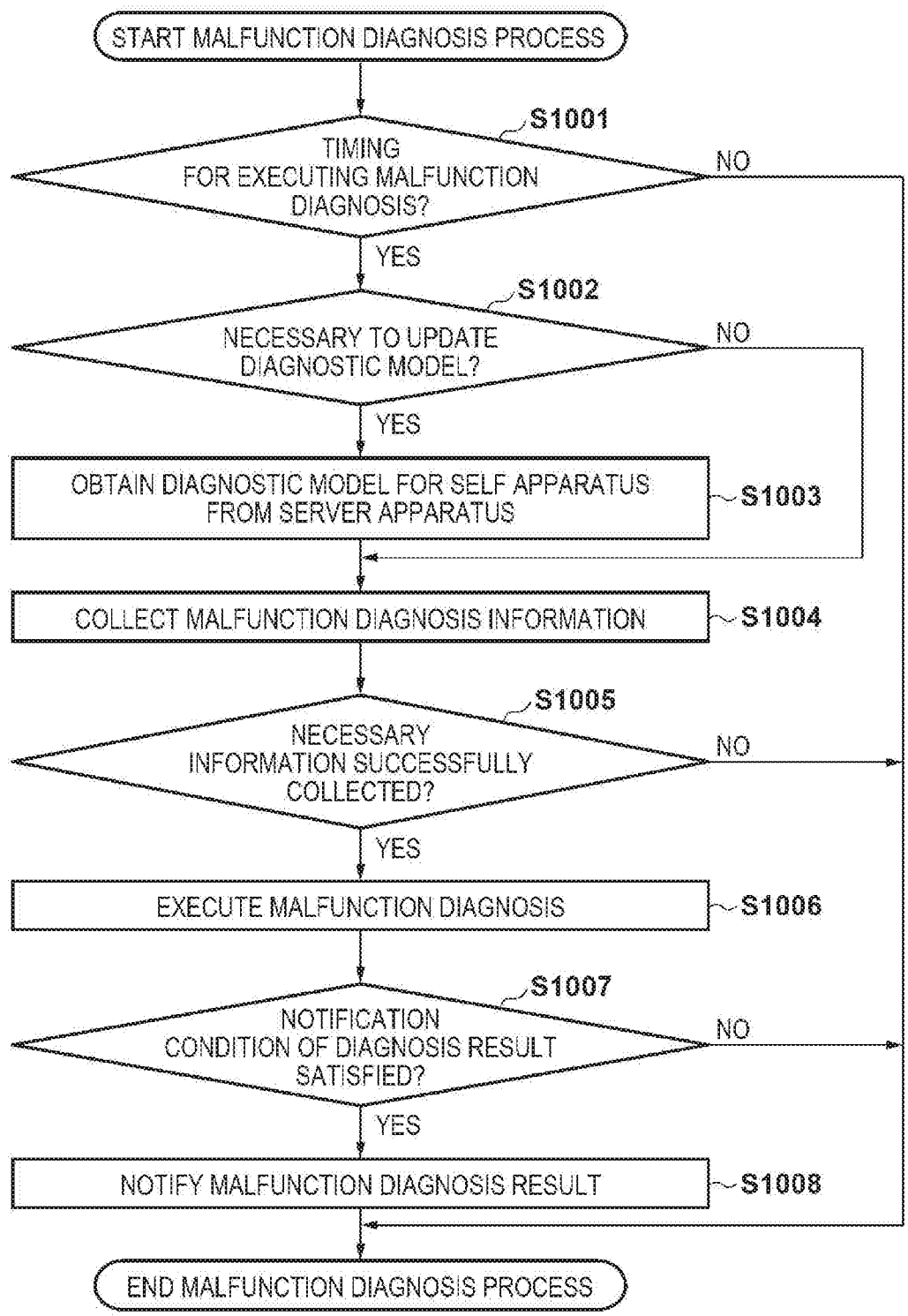

[Fig. 11]
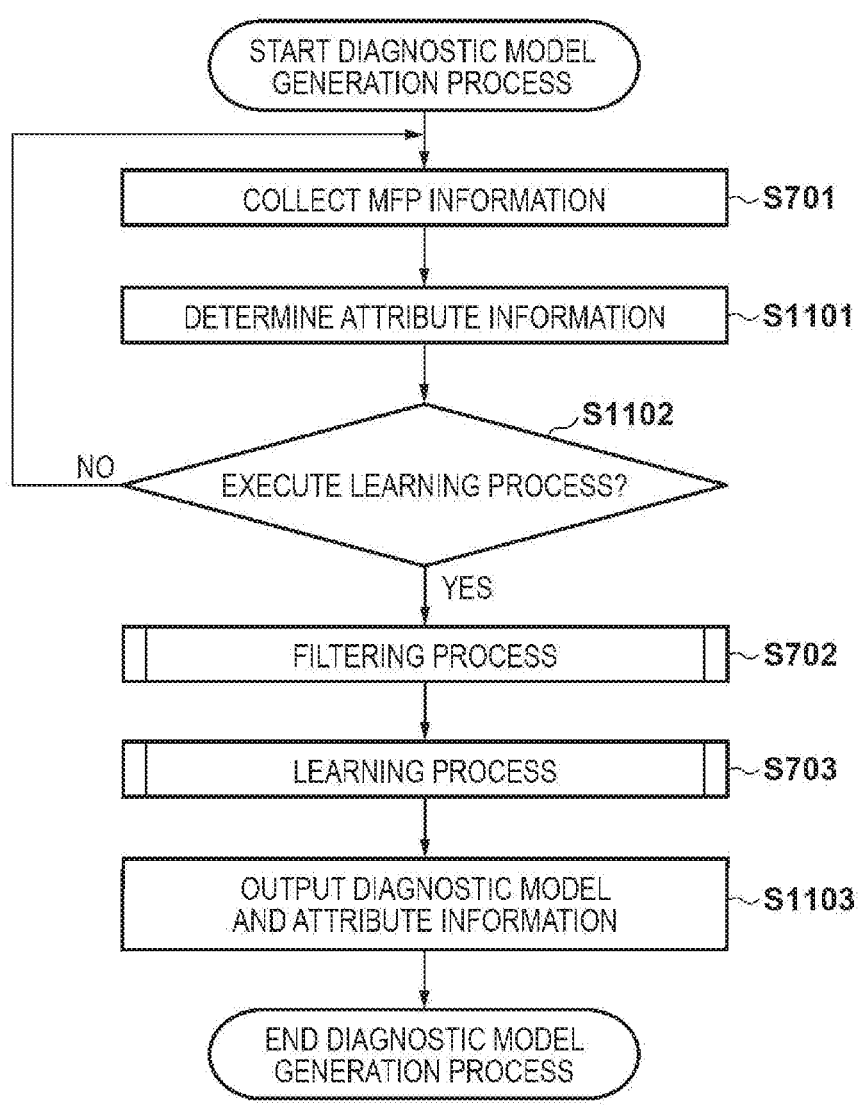

[Fig. 12]
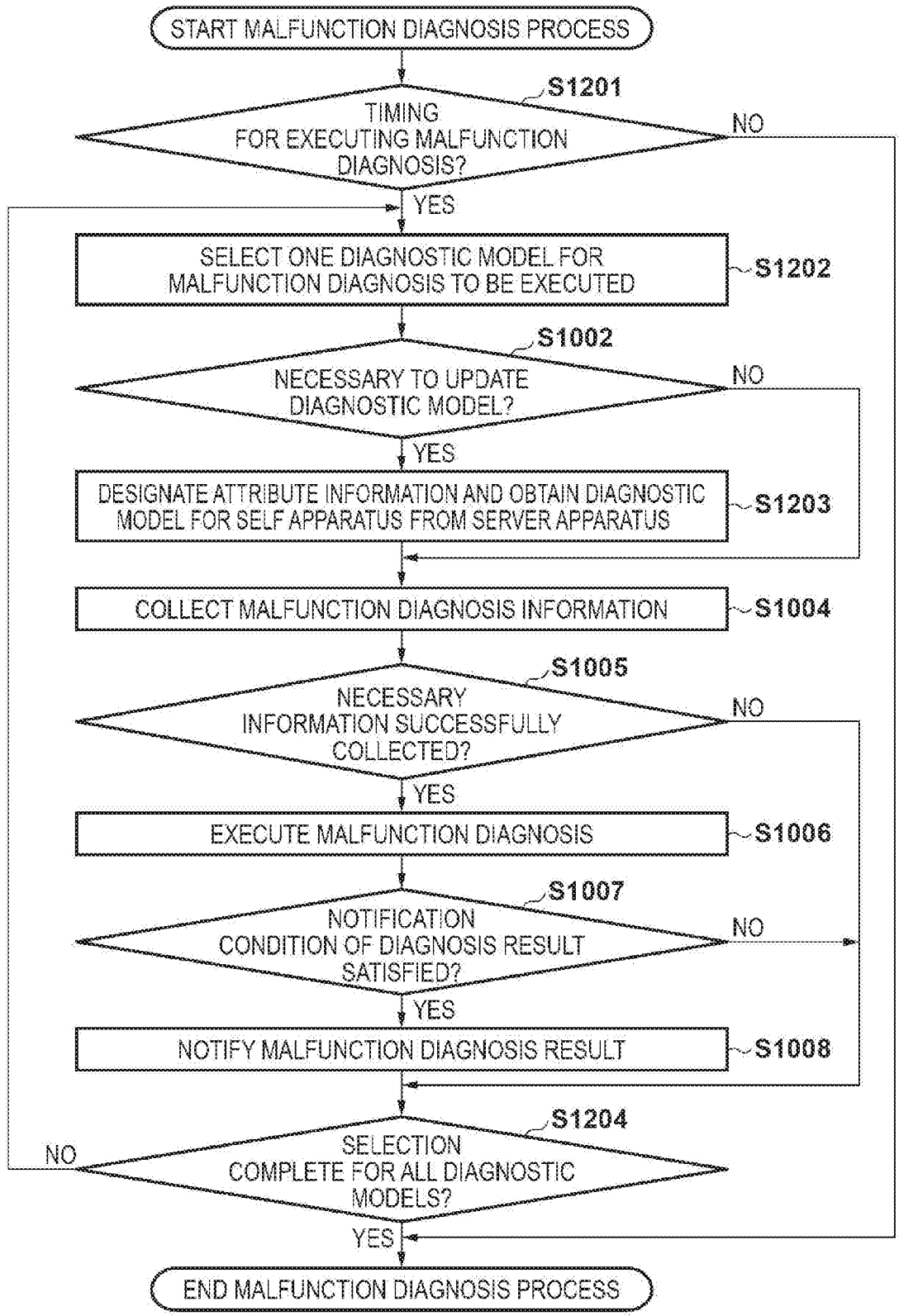

[Fig. 13A]
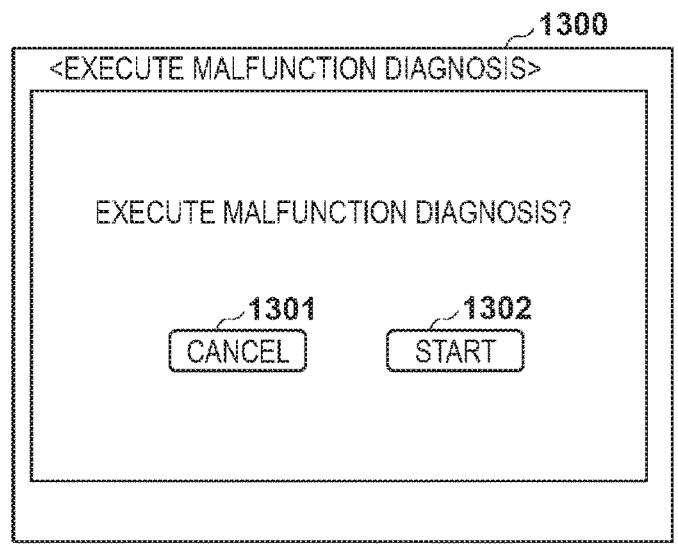
[Fig. 13B]
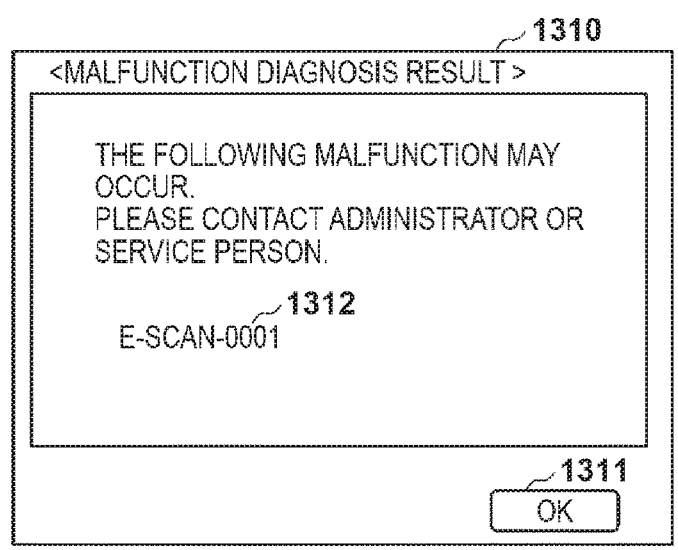
[Fig. 13C]
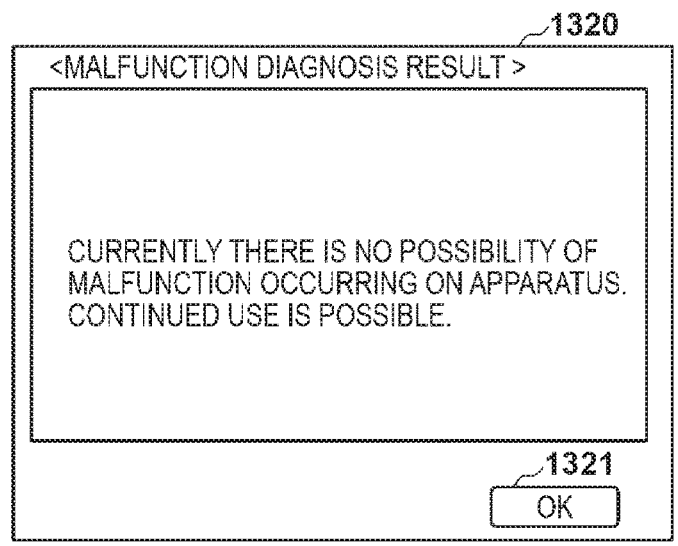

[Fig. 14]
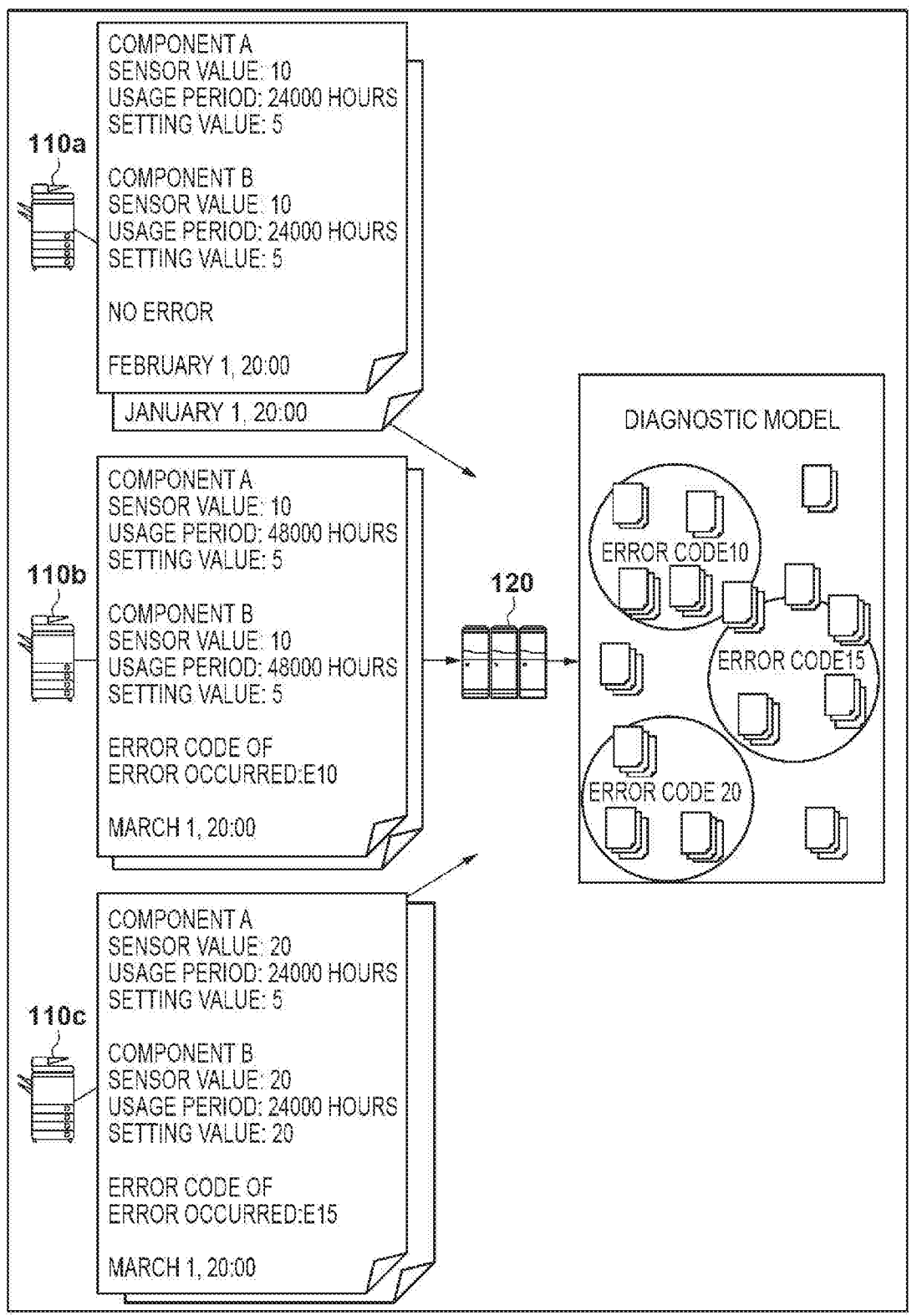

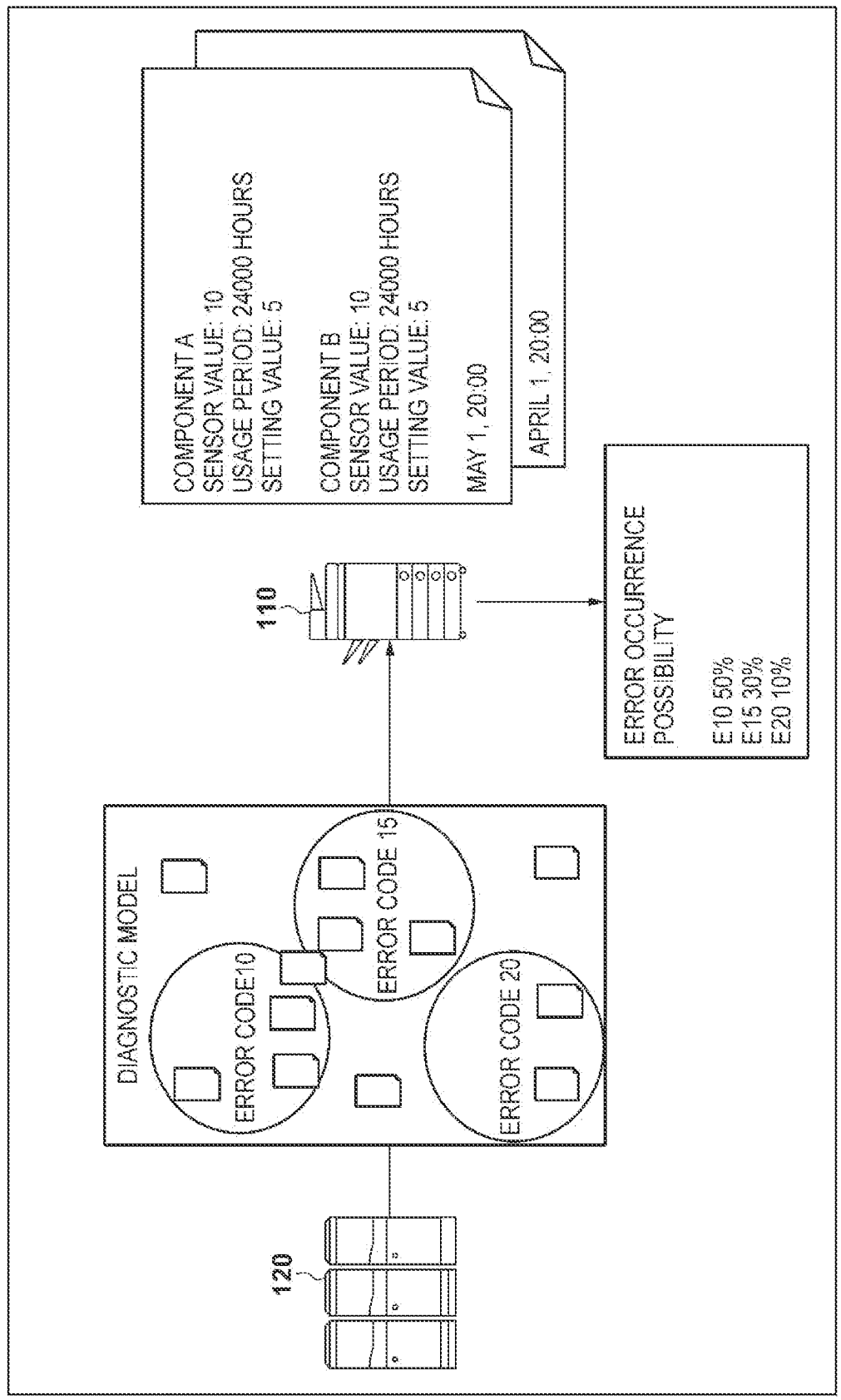
[Fig. 15]

[Fig. 16]
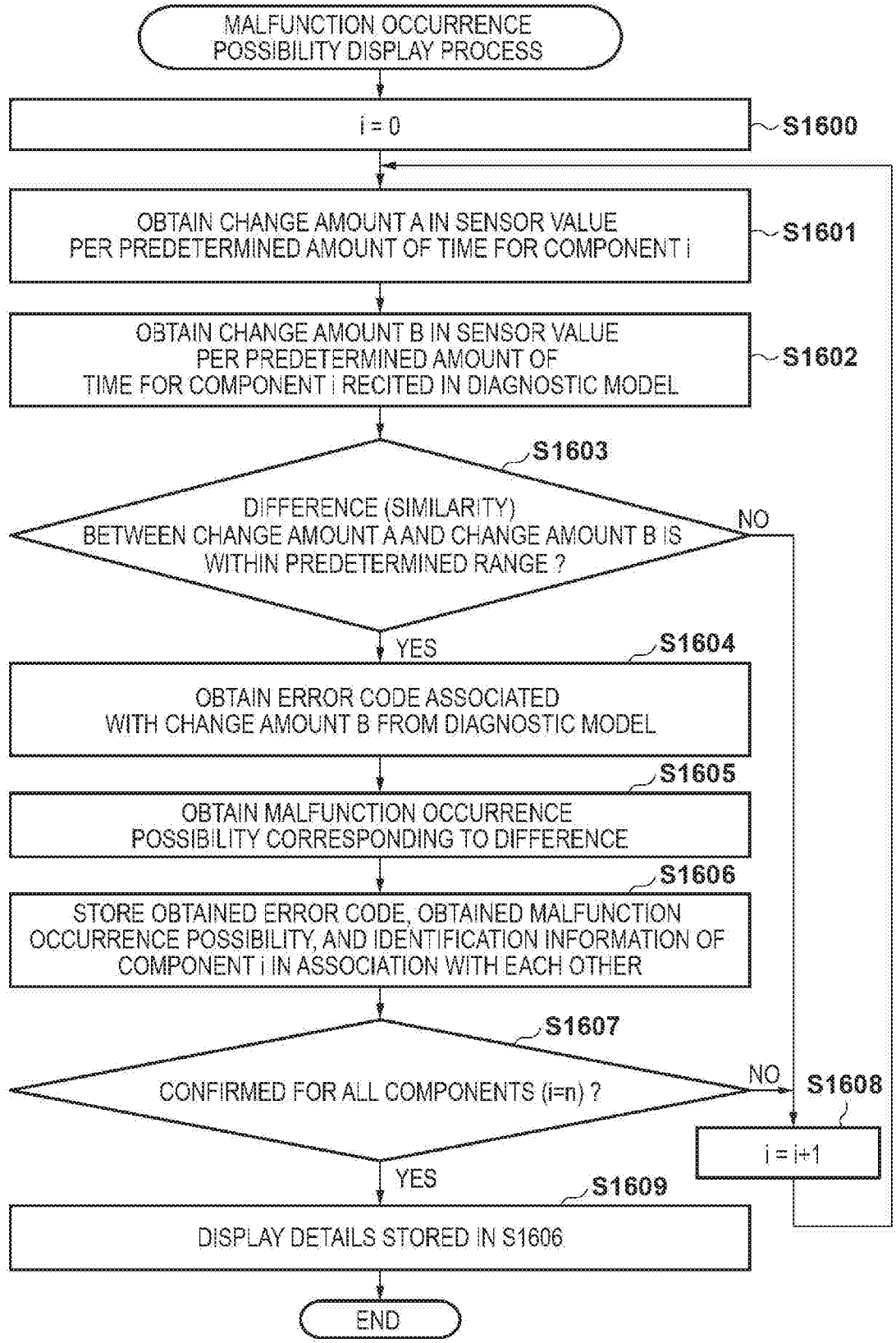

DIAGNOSING AN INFORMATION PROCESSING SYSTEM MALFUNCTION VIA DIAGNOSTIC MODELING

TECHNICAL FIELD

The present invention relates to an information processing system in which a diagnostic model, which is used to diagnose a malfunction in an information processing apparatus such as an image forming apparatus, is generated by a server apparatus and provided to the information processing apparatus.

BACKGROUND ART

Recently, image forming apparatuses such as multifunction peripherals (MFPs) are provided with increasingly diverse and advanced functions. As such, when a problem arises in the apparatus, it takes longer to restore the apparatus than has been the case in the past. The increased complexity of such an apparatus also makes it difficult to identify the cause of a malfunction, and thus in some cases, simply restoring the apparatus is difficult.

A malfunction diagnostic system, which uses a diagnostic model corresponding to error information, is known as a system that assists in the identifying the cause of a malfunction when such a malfunction has occurred in an image forming apparatus. For example, Japanese Patent Laid-Open No. 2008-017269 proposes a technique in which a diagnostic model is generated using not only the error information, but also an operating mode (the function that was being provided at the time of the malfunction) and malfunction information entered by a user, in order to improve the accuracy of the malfunction diagnosis.

In the aforementioned known technique, the diagnostic model is generated on the basis of information such as the error information, the operating mode, and the malfunction information entered by the user, and the cause of the malfunction is then identified using that diagnostic model. However, dynamic information, such as information indicating a change in setting values or sensor values over time, is not taken into account in generating the diagnostic model. The technique furthermore does not detect indications that a malfunction may occur prior to the malfunction actually occurring.

SUMMARY OF INVENTION

Having been achieved in light of the above-described problems, the present invention provides a technique in which an information processing apparatus makes a more accurate malfunction diagnosis using a diagnostic model generated by a server apparatus on the basis of information collected from the information processing apparatus.

According to one aspect of the present invention, there is provided an information processing system comprising a server apparatus and an information processing apparatus capable of communicating with the server apparatus, the server apparatus comprising: generation means for collecting, from a plurality of information processing apparatuses including the information processing apparatus, time series information indicating a change over time in settings and a state of each information processing apparatus, and error information indicating an error that has occurred in each information processing apparatus, and generating learning data including the collected information; and learning means for generating a diagnostic model through learning based on the learning data generated by the generation means, the diagnostic model being a trained model for a malfunction diagnosis in the information processing apparatus, and the information processing apparatus comprising: obtainment means for obtaining, from the server apparatus, the diagnostic model generated by the server apparatus; and execution means for outputting a diagnosis result indicating a likelihood that an error will occur in the information processing apparatus by collecting information necessary for the malfunction diagnosis within the information processing apparatus and executing the malfunction diagnosis using the collected information and the diagnostic model obtained by the obtainment means.

According to another aspect of the present invention, there is provided a server apparatus capable of communicating with an information processing apparatus, the server apparatus comprising: generation means for collecting, from a plurality of information processing apparatuses including the information processing apparatus, time series information indicating a change over time in settings and a state of each information processing apparatus, and error information indicating an error that has occurred in each information processing apparatus, and generating learning data including the collected information: learning means for generating a diagnostic model through learning based on the learning data generated by the generation means, the diagnostic model being a trained model for a malfunction diagnosis in the information processing apparatus, and a diagnosis result indicating a likelihood that an error will occur in the information processing apparatus being output as a result of the malfunction diagnosis using the diagnostic model; and sending means for sending the diagnostic model generated by the learning means to the information processing apparatus in accordance with an obtainment request from the information processing apparatus.

According to still another aspect of the present invention, there is provided an information processing apparatus capable of communicating with a server apparatus, the server apparatus generating a diagnostic model, which is a trained model for a malfunction diagnosis in the information processing apparatus, by collecting, from a plurality of information processing apparatuses including the information processing apparatus, time series information indicating a change over time in settings and a state of each information processing apparatus, and error information indicating an error that has occurred in each information processing apparatus, and carrying out learning on the basis of learning data including the collected information, the information processing apparatus comprising: obtainment means for obtaining, from the server apparatus, the diagnostic model generated by the server apparatus; and execution means for outputting a diagnosis result indicating a likelihood that an error will occur in the information processing apparatus by collecting information necessary for the malfunction diagnosis within the information processing apparatus and executing the malfunction diagnosis using the collected information and the diagnostic model obtained by the obtainment means.

According to yet another aspect of the present invention, there is provided a control method of a server apparatus capable of communicating with an information processing apparatus, the control method comprising: collecting, from a plurality of information processing apparatuses including the information processing apparatus, time series information indicating a change over time in settings and a state of each information processing apparatus, and error information indicating an error that has occurred in each information processing apparatus, and generating learning data including the collected information: generating a diagnostic model through learning based on the generated learning data, the diagnostic model being a trained model for a malfunction diagnosis in the information processing apparatus, and a diagnosis result indicating a likelihood that an error will occur in the information processing apparatus being output as a result of the malfunction diagnosis using the diagnostic model; and sending the generated diagnostic model to the information processing apparatus in accordance with an obtainment request from the information processing apparatus.

According to still yet another aspect of the present invention, there is provided a control method of an information processing apparatus capable of communicating with a server apparatus, the server apparatus generating a diagnostic model, which is a trained model for a malfunction diagnosis in the information processing apparatus, by collecting, from a plurality of information processing apparatuses including the information processing apparatus, time series information indicating a change over time in settings and a state of each information processing apparatus, and error information indicating an error that has occurred in each information processing apparatus, and carrying out learning on the basis of learning data including the collected information, the control method comprising: obtaining, from the server apparatus, the diagnostic model generated by the server apparatus; and outputting a diagnosis result indicating a likelihood that an error will occur in the information processing apparatus by collecting information necessary for the malfunction diagnosis within the information processing apparatus and executing the malfunction diagnosis using the collected information and the obtained diagnostic model.

Further features of the present invention will become apparent from the following description of exemplary embodiments (with reference to the attached drawings).

BRIEF DESCRIPTION OF DRAWINGS

FIG. 1 is a diagram illustrating an example of the configuration of a communication system.

FIG. 2 is a block diagram illustrating an example of the hardware configuration of an MFP.

FIG. 3 is a block diagram illustrating an example of the hardware configuration of a controller unit in the MFP.

FIG. 4 is a block diagram illustrating an example of the hardware configuration of a server apparatus.

FIG. 5 is a block diagram illustrating an example of the functional configuration of the MFP.

FIG. 6 is a block diagram illustrating an example of the functional configuration of the server apparatus.

FIG. 7 is a flowchart illustrating the sequence of a diagnostic model generation process carried out by the server apparatus.

FIG. 8 is a flowchart illustrating the sequence of a filtering process carried out by the server apparatus.

FIG. 9 is a flowchart illustrating the sequence of a learning process carried out by the server apparatus.

FIG. 10 is a flowchart illustrating the sequence of a malfunction diagnosis process carried out by the MFP.

FIG. 11 is a flowchart illustrating the sequence of a diagnostic model generation process according to a second embodiment.

FIG. 12 is a flowchart illustrating the sequence of a malfunction diagnosis process according to the second embodiment.

FIG. 13A is a diagram illustrating an example of an operating screen pertaining to malfunction diagnosis in the MFP.

FIG. 13B is a diagram illustrating an example of an operating screen pertaining to malfunction diagnosis in the MFP.

FIG. 13C is a diagram illustrating an example of an operating screen pertaining to malfunction diagnosis in the MFP.

FIG. 14 is a diagram illustrating an overview of a diagnostic model generation process carried out by the server apparatus.

FIG. 15 is a diagram illustrating an overview of a method for applying a generated diagnostic model.

FIG. 16 is a flowchart illustrating a malfunction occurrence possibility display process.

DESCRIPTION OF EMBODIMENTS

Hereinafter, embodiments of the present invention will be described in detail with reference to the accompanying drawings. It should be noted that the following embodiments are not intended to limit the scope of the appended claims, and that not all the combinations of features described in the embodiments are necessarily essential to the solving means of the present invention.

The following first and second embodiments will describe examples in which the present invention is applied in an image forming apparatus. Note, however, that the present invention can be applied in any information processing apparatus, and can therefore also be applied in a printing apparatus, a copier, a multifunction peripheral, a facsimile apparatus, and the like, for example.

First Embodiment (System Configuration)

FIG. 1 is a diagram illustrating an example of the configuration of an information processing system (a communication system) according to an embodiment of the present invention. In the information processing system illustrated in FIG. 1, multifunction peripherals (MFPs) 110a and 110b and a server apparatus 120 are connected to a network 100, and are capable of communicating with each other over the network 100. The network 100 is constituted by a wired local area network (LAN), for example.

The server apparatus 120 collects information of client apparatuses such as the MFPs 110a and 110b, and also manages diagnostic models for diagnosing malfunctions in the client apparatuses. The server apparatus 120 has a function for collecting information from the MFPs 110a and 110b, a function for generating a diagnostic model from the collected information, and a function for sending the generated diagnostic model to the MFPs 110a and 110b.

The MFPs 110 (110a and 110b) are information devices having a plurality of functions, such as printing, copying, scanning, facsimile (fax) transmission, and so on. In the present embodiment, the MFPs 110 function as client apparatuses of the server apparatus 120. Each MFP 110 has a function for sending information generated within the MFP to the server apparatus 120, a function for obtaining a diagnostic model from the server apparatus 120, and a function for using the obtained diagnostic model to diagnose a malfunction in the MFP itself.

Each MFP 110 stores, in that MFP itself, setting values used when executing the respective functions and an operation log (event log) for when the functions are executed, and can send that information to the server apparatus 120. Additionally, when the MFP 110 receives information indicating that the server apparatus 120 has changed (updated) the diagnostic model, the MFP 110 updates the diagnostic model held in that MFP by obtaining a diagnostic model for that MFP from the server apparatus 120. The MFP 110 diagnoses a malfunction in that MFP itself using a diagnostic model pertaining to the setting values and event log stored in that MFP itself. The MFP 110 then communicates a result of the diagnosis to a user or administrator of that MFP as necessary.

(MFP Hardware Configuration)

FIG. 2 is a block diagram illustrating an example of the hardware configuration of the MFPs 110 according to the present embodiment. Each MFP 110 includes a controller unit 201, a printer controller 202, a scanner controller 203, a printer 204, a scanner 205, and an operation unit 206. The controller unit 201 is connected with the printer controller 202, the scanner controller 203, and the operation unit 206, and controls the operations of the MFP 110 as a whole. The printer controller 202 controls the printer 204, which is an image output device. The scanner controller 203 controls the scanner 205, which is an image input device.

FIG. 3 is a block diagram illustrating an example of the hardware configuration of the controller unit 201. The controller unit 201 includes a CPU 301, ROM 302, RAM 303, and an HDD (hard disk drive) 304. The controller unit 201 further includes a network interface (I/F) 305, an operation unit I/F 306, an image processing unit 307, and a device controller I/F 308. These devices are connected to a system bus 310.

The CPU 301 launches an operating system (OS) by executing a boot program stored in the ROM 302. The ROM 302 stores control programs that are executed by the CPU 301. The CPU 301 executes various types of processes by executing, in the OS, application programs stored in the ROM 302 or the HDD 304. The RAM 303 provides a work area for the CPU 301 and provides an image memory area for temporarily storing image data. Various types of programs such as the above-described application programs, various types of data such as image data, and various types of setting values are stored in the HDD 304.

The operation unit I/F 306 is an interface with the operation unit 206. The operation unit 206 includes a display (display unit) having touch panel functionality. The operation unit I/F 306 outputs, to the operation unit 206, screen data of screens to be displayed in the operation unit 206. Additionally, the operation unit I/F 306 transmits information, which has been input by a user through the operation unit 206, to the CPU 301.

The printer controller 202 and the scanner controller 203 are connected to the device controller I/F 308. The device controller I/F 308 executes input and output of data or control signals. The network I/F 305 is connected to the network 100, and communicates (input/outputs information) with external apparatuses such as the server apparatus 120 and another MFP 110 over the network 100. The image processing unit 307 carries out image processing on image data to be output to the printer 204 and image data input from the scanner 205. The image processing unit 307 carries out processing such as image rotation, image compression, resolution conversion, color space conversion, tone conversion, and the like.

(Server Apparatus Hardware Configuration)

FIG. 4 is a block diagram illustrating an example of the hardware configuration of the server apparatus 120 according to the present embodiment. The server apparatus 120 includes a controller unit 400 and an operation unit 420. The controller unit 400 includes a CPU 401. ROM 402, RAM 403, an HDD 404, an operation unit I/F 405, and a network I/F 406. These devices within the controller unit 400 are connected to a system bus 410.

The CPU 401 launches an OS by executing a boot program stored in the ROM 402. The ROM 402 stores control programs that are executed by the CPU 401. The CPU 401 executes various types of processes by executing, in the OS, application programs stored in the ROM 402 or the HDD 404. The RAM 403 provides a work area for the CPU 401. Various types of programs such as the above-described application programs, various types of data, and various types of setting values are stored in the HDD 404.

The operation unit I/F 405 is an interface with the operation unit 420. The operation unit 420 includes an input device such as a mouse or keyboard and a display device such as a liquid crystal display. The operation unit I/F 405 outputs, to the operation unit 420, screen data of screens to be displayed in the operation unit 420. Additionally, the operation unit I/F 405 transmits information, which has been input by a user through the operation unit 420, to the CPU 401. The network I/F 406 is connected to the network 100, and communicates (input/outputs information) with external apparatuses such as the MFPs 110 over the network 100.

(Functional Configuration of MFP)

FIG. 5 is a block diagram illustrating an example of the software configuration of the MFPs 110 according to the present embodiment, and illustrates an example of a functional configuration implemented by MFP firmware 500. The function units illustrated in FIG. 5 are realized by programs of the MFP firmware 500, which are stored in a storage device such as the ROM 302 or the HDD 304, being read out from the storage device and executed by the CPU 301.

A job management unit 501 is connected with the network 100 through the network I/F 305. The job management unit 501 receives a job, such as a print job, from an external apparatus using a specific communication protocol, and executes the received job. Additionally, the job management unit 501 executes a job such as a copy job, a print job, or scan job in response to a notification received from an operation unit control unit 502. Upon executing a job, the job management unit 501 saves an execution history of that job in a job history database (DB) 504.

The job management unit 501 also has a function for providing data pertaining to a job in response to an inquiry from another function unit, and a function for accepting an event subscription request from another function unit and transferring an event in accordance with the subscription request. The job management unit 501 transfers the event when the execution state of the job has changed, such as when the job starts, is paused, and ends.

The job history DB 504 stores the execution history of the job. The execution history includes information pertaining to the execution of the job (a starting date/time and ending date/time of the job, a number of sheets supplied, a number of sheets discharged, whether or not staples are used, and so on), but other information may be included as well. Note that the job execution history stored in the job history DB 504 is stored in the HDD 304.

The operation unit control unit 502 receives data indicating the details of user operations, accepted by the operation unit 206, for instructing a job such as a copy job or a scan job to be executed, the data being received from the operation unit 206 through the operation unit I/F 306. The operation unit control unit 502 communicates the details of the user operations accepted from the user to the job management unit 501 as described above. The operation unit control unit 502 also communicates the details of the user operations accepted from the user, control events occurring within the MFP 110, and malfunction information pertaining to a malfunction occurring in the operation unit 206, to a structuring unit 505.

Of the information sent to the structuring unit 505, the "details of the user operations" are, for example, a button displayed in the operation unit 206 being pressed or an operation by the user to log into the MFP 110. The "control events occurring within the MFP 110" are, for example, the MFP 110 being started up or the MFP 110 transitioning to a sleep state. The "malfunction information" is information for specifying the details of a malfunction that has occurred in the operation unit 206, and is information such as a Universal Unique ID (UUID).

A device control unit 520 controls various devices (the printer 204 and the scanner 205) by controlling the printer controller 202 and the scanner controller 203 through the device controller I/F 308. Specifically, the device control unit 520 accepts image data to be processed and control details from the job management unit 501, and controls the printer controller 202 and the scanner controller 203 in accordance with the control details that have been accepted. The device control unit 520 communicates the control details for the respective devices and information received from the printer controller 202 or the scanner controller 203, to a structuring unit 521.

The information received by the device control unit 520 from the printer controller 202 or the scanner controller 203 includes the following information, for example:
  setting information of the printer 204 or the scanner 205 (information of setting values and the like);
  usage information of the components (parts) constituting the printer 204 or the scanner 205 (information of usage periods and the like);
  output values from sensors (temperature sensors and the like) provided in the printer 204 or the scanner 205; and
  malfunction information of the printer 204 or the scanner 205.

The printer controller 202 or the scanner controller 203 may temporarily store the information to be provided to the device control unit 520. In this case, the device control unit 520 obtains the information stored by the printer controller 202 or the scanner controller 203.

A structuring unit 503 converts data output from the job management unit 501 (i.e., data pertaining to the execution of a job) into structured data in accordance with a predetermined data schema. The structuring unit 505 converts data output from the operation unit control unit 502 (i.e., data pertaining to user operations) into structured data in accordance with a predetermined data schema. The structuring unit 521 converts data output from the device control unit 520 (i.e., data pertaining to the control of the devices in the MFP 110) into structured data in accordance with a predetermined data schema.

As a result of the conversions, the above-described structuring units 503, 505, and 521 generate data that can be interpreted by an intermediate data generation unit 522. A process of adding a data creation date/time or a new Universal Unique ID (UUID) for uniquely identifying the data, and a process of converting the data into data having a predetermined hierarchical structure or format, can be given as specific examples of the data conversion. These conversions are carried out in order to handle multiple types of data in a unified manner, or to process data, in which information is encoded or simplified to improve the efficiency of processing, to make later analysis easier. In addition to the above-described processing, the above-described structuring units may furthermore subject the data to be transmitted to the server apparatus 120, to data structure-related preprocessing as necessary.

The intermediate data generation unit 522 converts the data, generated by the structuring units 503, 505, and 521 and expressed in a predetermined format, into intermediate data, which is data in a data format that can be preserved for the purpose of buffering. Using a data format that reduces the data size as much as possible as the data format of the intermediate data makes it possible to increase the amount of data that can be accumulated in a buffer DB 509. For example, a data format such as Concise Binary Object Representation (CBOR), which makes the data size variable depending on the range, may be used, or a coding format such as Huffman coding may be used. Alternatively, these formats may be combined.

A buffer control unit 507 stores, in the buffer DB 509, intermediate data to be buffered, which has been generated by the intermediate data generation unit 522, so as to buffer that intermediate data. The buffer control unit 507 also has a function for instructing a buffer notification unit 510 to make a notification pertaining to the buffering of the intermediate data (event log) in the buffer DB 509.

The buffer DB 509 is a database for buffering the intermediate data before the intermediate data is sent to the server apparatus 120. The buffer DB 509 is provided as a buffer for compensating for a difference between the timing at which the intermediate data is generated and the timing at which that intermediate data is sent to the server apparatus 120 as an event log. For example, intermediate data generated and buffered while communication with the server apparatus 120 is suspended due to a communication failure or the like continues to be held in the buffer DB 509 until communication with the server apparatus 120 is once again possible. Once communication with the server apparatus 120 is again possible, the intermediate data held in the buffer DB 509 is sequentially sent (the data converted by a data conversion unit 511 is sent). The intermediate data corresponding to data that has been successfully sent by a server communication unit 512 is then deleted from the buffer DB 509 by the buffer control unit 507.

Upon receiving a notification from the buffer control unit 507, the buffer notification unit 510 sends, to the server communication unit 512 and a diagnosis control unit 515, a storage notification indicating that the intermediate data (event log) is stored (buffered) in the buffer DB 509.

The data conversion unit 511 converts the intermediate data, generated by the intermediate data generation unit 522 and corresponding to an event log, into data in a data format that can be interpreted by the server apparatus 120. The data format of the event log generated as a result of the conversion by the data conversion unit 511 is the JavaScript (registered trademark) Object Notation (JSON) format, for example. The JSON format is a data format that is widely used in internet communications.

A filtering unit 513 carries out a filtering process of confirming the details of the event log to be sent by the server communication unit 512 and determining whether or not that event log should actually be sent to the server apparatus 120. This filtering process is carried out in order to reduce the amount of data sent in accordance with the conditions of the communication line, or so that the server apparatus 120 can obtain specific events only from apparatuses being in a predetermined state, for example.

The server communication unit 512 sends the event log pertaining to an event that has occurred in that MFP, extracted through the filtering process carried out by the filtering unit 513, to the server apparatus 120 over the network 100. Specifically, upon receiving a notification from the buffer notification unit 510, the server communication unit 512 uses the filtering unit 513 to extract an event log, among the event logs stored in the buffer DB 509, that is required to be sent. Furthermore, the server communication unit 512 sends the extracted event log to the server apparatus 120, and once the sending is complete, stands by to receive the next notification from the buffer notification unit 510.

Function Unit Group Pertaining to Malfunction Diagnosis

A function unit group that implements processing pertaining to the diagnosis of a malfunction in the MFP 110 will be described next. This function unit group includes an information collection unit 514, the diagnosis control unit 515, a diagnostic model management unit 516, a diagnosis result notification unit 517, a diagnosis processing unit 518, and a diagnostic model DB 519.

The diagnosis control unit 515 controls the information collection unit 514, the diagnostic model management unit 516, and the diagnosis processing unit 518 to realize the diagnosis of a malfunction in the MFP 110. Upon receiving a notification from the buffer notification unit 510, the diagnosis control unit 515 determines whether or not to execute malfunction diagnosis on the basis of details in the event log pertaining to the received notification. The diagnosis control unit 515 determines to execute malfunction diagnosis in the following cases, for example:

- a case of receiving a notification pertaining to a specific event log (i.e., a case where an event log pertaining to a specific event has been produced);
- a case where, at the point in time when the notification pertaining to the event log is received, a predetermined amount of time has passed following the previous malfunction diagnosis (i.e., a case where, when an event log to be transmitted to the server apparatus 120 has been produced, a predetermined amount of time has passed following the previous malfunction diagnosis); and
- a case where an instruction to execute malfunction diagnosis has been received from the user.

In accordance with the results of the above-described determinations, the diagnosis control unit 515 instructs the diagnostic model management unit 516 to obtain a diagnostic model, instructs the information collection unit 514 to collect information for diagnosing the malfunction, and instructs the diagnosis processing unit 518 to execute malfunction diagnosis.

The diagnostic model management unit 516 manages diagnostic models used by the MFP 110 to diagnose malfunctions. Upon receiving an instruction to obtain a diagnostic model from the diagnosis control unit 515, the diagnostic model management unit 516 sends a diagnostic model obtainment request to the server apparatus 120 via the server communication unit 512. If a diagnostic model has been successfully obtained from the server apparatus 120, the diagnostic model management unit 516 saves and manages the obtained diagnostic model in the diagnostic model DB 519. The diagnostic model management unit 516 provides a diagnostic model saved and managed in the diagnostic model DB 519 to the diagnosis control unit 515 as a response to the obtainment instruction from the diagnosis control unit 515.

When obtaining a diagnostic model from the server apparatus 120, if there is a diagnostic model already saved in the diagnostic model DB 519, the diagnostic model management unit 516 determines whether or not to update the saved diagnostic model, and updates the diagnostic model as necessary. For example, the diagnostic model management unit 516 may update the diagnostic model in the diagnostic model DB 519 if communication with the server apparatus 120 has been successfully carried out. Additionally, the diagnostic model management unit 516 may compare a timestamp added to the obtained diagnostic model with a timestamp added to the diagnostic model in the diagnostic model DB 519 and update the diagnostic model in accordance with the result of the comparison. In this case, the diagnostic model management unit 516 updates the diagnostic model as necessary so that the newer diagnostic model is saved in the diagnostic model DB 519.

The information collection unit 514 collects information necessary for diagnosing a malfunction (malfunction diagnosis information) in the MFP 110 in response to a collection instruction from the diagnosis control unit 515. The information collection unit 514 collects the information from the buffer DB 509 or a setting value DB (not shown), for example. Event logs necessary for executing malfunction diagnosis are collected from the buffer DB 509. Setting values for various types of settings in the MFP 110 are collected from the setting value DB. Note that the setting values stored in the setting value DB are stored in the HDD 304.

A designation of the information (event log or setting values) to be collected from the information collection unit 514 may be included in the collection instruction from the diagnosis control unit 515 to the information collection unit 514. If the collection instruction does not include such a designation, the information collection unit 514 may collect predetermined information as the malfunction diagnosis information.

The diagnosis control unit 515 instructs the diagnosis processing unit 518 to execute malfunction diagnosis on the basis of the diagnostic model provided by the diagnostic model management unit 516 and the information collected by the information collection unit 514. The diagnosis processing unit 518 execute the malfunction diagnosis in accordance with the instruction from the diagnosis control unit 515. Specifically, based on the diagnostic model, the diagnosis processing unit 518 determines input parameters for the diagnostic model from among the information collected by the information collection unit 514, and executes the malfunction diagnosis using the determined input parameters. Furthermore, the diagnosis processing unit 518 outputs, to the diagnosis result notification unit 517, output parameters obtained as a result of the malfunction diagnosis.

On the basis of the diagnosis result (output parameters) output from the diagnosis processing unit 518, the diagnosis result notification unit 517 determines whether or not to make a notification of the diagnosis result. If the diagnosis result notification unit 517 has determined to make the notification of the diagnosis result, the diagnosis result notification unit 517 requests the operation unit control unit 502 to make the notification of the diagnosis result using the operation unit 206, for example.

In the present embodiment, the diagnosis result notification unit 517 notifies the user or administrator of the MFP 110 of the diagnosis result in a case where the diagnosis result output from the diagnosis processing unit 518 indicates that the likelihood that a malfunction (an error) will occur in the MFP 110. For example, the diagnosis result notification unit 517 may make a warning notification, indicating that the likelihood that an error will occur, if it has been determined, on the basis of the diagnosis result output from the diagnosis processing unit 518, that the likelihood of some sort of error occurring has increased. Additionally, the diagnosis result notification unit 517 may hold parameter values indicating the likelihood of an error occurring for each of error types, and may make the warning notification if the total value of the parameter values corresponding to the different error types has exceeded a predetermined threshold. Furthermore, if the malfunction diagnosis has been carried out in response to an execution instruction from the user, the diagnosis result notification unit 517 may make the notification of the diagnosis result using the operation unit 206 upon the malfunction diagnosis being completed.

Operating Screens Pertaining to Malfunction Diagnosis

FIGS. 13A to 13C are diagrams illustrating examples of operating screens pertaining to malfunction diagnosis, and illustrate examples of screens displayed in the operation unit 206 of the MFP 110.

An operating screen 1300 illustrated in FIG. 13A is an operating screen for accepting, from the user, an instruction as to whether or not to start a malfunction diagnosis. The operating screen 1300 is displayed in the operation unit 206 in response to a user operation made through the operation unit 206 of the MFP 110, for example. If a cancel button 1301 in the operating screen 1300 has been pressed, the display screen in the operation unit 206 returns to the screen that was being displayed in the operation unit 206 before the operating screen 1300 was displayed. On the other hand, if a start button 1302 in the operating screen 1300 is pressed, the malfunction diagnosis is started. After this, an operating screen 1310 or an operating screen 1320 is displayed in the operation unit 206, depending on the diagnosis result.

The operating screen 1310 illustrated in FIG. 13B is an example of a screen displayed in a case where the result of the malfunction diagnosis indicates that a specific error (malfunction) may occur. Error information 1312 indicating the error determined to possibly occur is included in the operating screen 1310 as information indicating the malfunction diagnosis result. The error information 1312 is changed depending on the malfunction diagnosis result. If an OK button 1311 in the operating screen 1310 has been pressed, the display screen in the operation unit 206 may return to a menu screen (not shown), for example, or to the operating screen 1300.

The operating screen 1320 illustrated in FIG. 13C is an example of a screen displayed in a case where the result of the malfunction diagnosis indicates that there is no likelihood that an error will occur. The operating screen 1320 includes a message indicating that there is no likelihood of an error (malfunction) occurring, and that the MFP 110 can continue to be used. If an OK button 1321 in the operating screen 1320 has been pressed, the display screen in the operation unit 206 may return to a menu screen (not shown), for example, or to the operating screen 1300.

(Functional Configuration of Server Apparatus)

FIG. 6 is a diagram illustrating an example of the software configuration of the server apparatus 120 according to the present embodiment, and illustrates an example of a functional configuration realized by a model generation service 600. The function units illustrated in FIG. 6 are realized by programs of the model generation service 600, which are stored in a storage device such as the ROM 402 or the HDD 404, being read out from the storage device and executed by the CPU 401.

An event log receiving unit 601 is connected with the network 100 via a network I/F 407, and receives an event log from a client apparatus (the MFP 110, in the present embodiment) using a specific communication protocol. At that time, the event log receiving unit 601 notifies an event log management unit 604 of the received event log, and notifies an MFP information management unit 602 of apparatus information (device information) and setting information of the MFP 110 from which the event log was sent.

The MFP information management unit 602 manages, as MFP information, the apparatus information and setting information of the client apparatus (MFP 110) that connects to the server apparatus 120 (the model generation service 600). An MFP information DB 603 stores, as the MFP information, the apparatus information and the setting information of the MFP 110, which sent the event log to the server apparatus 120. Upon receiving the notification from the event log receiving unit 601, the MFP information management unit 602 updates the information stored in the MFP information DB 603.

The event log management unit 604 manages the event log received from the MFP 110 in a state where the event log is stored in an event log DB 605. The event log management unit 604 stores (registers) the event log received from the MFP 110 in the event log DB 605, in accordance with the notification received from the event log receiving unit 601, and notifies a learning control unit 606 that the event log has been received.

The learning control unit 606 controls a diagnostic model learning process carried out by a learning processing unit 611. As the learning process control, the learning control unit 606 determines whether or not to execute the learning process. The learning control unit 606 can determine to execute the learning process if, for example, a predetermined number of event logs have been updated (registered) or an event log including the malfunction information (error information) has been updated (registered). The learning control unit 606 can also determine to execute the learning process if a predetermined amount of time has passed after the previous learning process was completed, or if an instruction to start the learning process has been received over the network 100. The learning control unit 606 can furthermore determine to execute the learning process if the MFP firmware 500 in the MFP 110 has been upgraded to a newer version.

Upon determining to execute the learning process, the learning control unit 606 instructs a filtering unit 607 to carry out a filtering process for generating learning data. The filtering unit 607 determines filtering conditions for generating the learning data in accordance with an instruction from the learning control unit 606. The filtering conditions may be set in advance, set through the operation unit 420 of the server apparatus 120, or determined on the basis of the details of the registered event log. The filtering unit 607 outputs a learning data generation instruction, including a designation of the determined filtering conditions, to a learning data generating unit 609.

The learning data generating unit 609 generates the learning data on the basis of the filtering conditions received from the filtering unit 607, and stores the generated learning data in a learning data DB 610. Specifically, using the information stored in the MFP information DB 603 and the event log DB 605, the learning data generating unit 609 generates the learning data so as to include information that satisfies the designated filtering conditions.

The learning data includes static information, dynamic information, and the error information. The static information is information pertaining to the MFP 110, such as model information of the MFP 110, parts information indicating parts in the MFP 110 such as sensors, and the like, for example. The dynamic information (time-based information) is an example of time series information indicating a change over time in the settings and state of each information processing apparatus (MFP 110). The dynamic information is, for example, information pertaining to a specific event log, and corresponds to information indicating a change in the settings or state of the MFP 110 over time, obtained from a plurality of event logs in time series. The error information is information that is obtained from the event log from which the information included in the dynamic information is collected, and that indicates an error (malfunction) that has occurred in each information processing apparatus (MFP 110).

The learning data generating unit 609 can also select an event log pertaining to the occurrence of an error (malfunction) from the event logs stored in the event log DB 605 and include the selected event log in the learning data. The number of event logs pertaining to the occurrence of an error included in the learning data may be determined on the basis of the number of instances of learning data generated, and the rate at which the specific error occurs, which is indicated by the event logs stored in the event log DB 605.

Once the generation of the learning data by the learning data generating unit 609 is complete, the learning control unit 606 instructs the learning processing unit 611 to execute the learning process. The instruction to execute the learning process, output from the learning control unit 606 to the learning processing unit 611, includes a designation of the learning data, among the learning data stored in the learning data DB 610, that is to be used in the learning process.

In accordance with the execution instruction received from the learning control unit 606, the learning processing unit 611 carries out a learning process for generating a diagnostic model by carrying out learning using the designated learning data. In the present embodiment, "learning" (broadly defined) includes the narrowly-defined machine learning, which carries out the learning process according to training data, as well as deep learning processes using neural networks. Unless otherwise specified, "learning" will hereinafter referred to the broad definition of learning. Once the learning process using the learning data ends, the learning processing unit 611 outputs to a diagnostic model management unit 612 a diagnostic model, which is a trained model obtained as a result of the learning process.

The diagnostic model management unit 612 stores and manages the diagnostic model output from the learning processing unit 611, along with the filtering conditions used to generate that diagnostic model, in a diagnostic model DB 613. In response to a diagnostic model obtainment request from a diagnostic model delivery unit 614, the diagnostic model management unit 612 obtains the diagnostic model that satisfies a condition designated in the obtainment request from the diagnostic model DB 613, and outputs the obtained diagnostic model to the diagnostic model delivery unit 614.

The diagnostic model delivery unit 614 is connected to the network 100 via the network I/F 407, and receives the diagnostic model obtainment request from the client apparatus (the MFP 110) using a specific communication protocol. Upon receiving the diagnostic model obtainment request, the diagnostic model delivery unit 614 sends the requested diagnostic model as a response to the received obtainment request. At that time, the diagnostic model delivery unit 614 notifies the diagnostic model management unit 612 of the information of the client apparatus (the MFP 110) that sent the obtainment request. If the diagnostic model could not be successfully obtained from the diagnostic model management unit 612, the diagnostic model delivery unit 614 sends, to the client apparatus (the MFP 110) that sent the obtainment request, a response indicating that the diagnostic model could not be obtained.

In the present embodiment, the diagnostic model used by the MFP firmware 500 and the model generation service 600 is generated according to a neural network model. The neural network is constituted by an input layer including L neurons, an intermediate layer (hidden layer) including M neurons, and an output layer including N neurons. In the neural network, the intermediate layer is not limited to one layer, and may be two or more layers, and it is not necessary that the same number of neurons be included in each intermediate layer. The learning process carried out by the learning processing unit 611 can also be realized by processing carried out by a CPU or a general-purpose computing on graphics processing unit (GPGPU). Alternatively, the learning process carried out by the learning processing unit 611 can also be realized by processing using a separate large-scale server.

If a neural network model is used, the diagnostic model is expressed by the structure of the neural network and weighting parameters of the intermediate layer in the neural network, which are updated through the learning. The structure of the neural network is expressed by the number and format of input parameters input to the input layer, the number and format of output parameters output from the output layer, and the structure of the intermediate layer. In this case, it is necessary for the MFP 110 and the server apparatus 120 to hold the same diagnostic model in terms of the number and format of the input parameters, the number and format of the output parameters, and the structure of the intermediate layer. Note that it is also possible to use only the weighting parameters of the intermediate layer as the information expressing the diagnostic model, with the assumption that the structure of the diagnostic model will not be changed.

In malfunction diagnosis using a diagnostic model such as that described above, a trained neural network is restored from the diagnostic model, the necessary parameters are input to the input layer of the neural network, and the output parameters are output from the output layer as the diagnosis result. The output parameters may be parameters indicating the likelihood of a specific malfunction (error) occurring, parameters indicating the likelihood of a plurality of malfunctions (errors) occurring, or parameters indicating the likelihood of a normal state occurring. The parameter values indicating the likelihood of a malfunction occurring can be values defining a maximum value or a minimum value, continuous values, or discrete values, for example.

(Diagnostic Model Generation Process by Server Apparatus)

The diagnostic model generation process carried out by the server apparatus 120 will be described next with reference to FIGS. 7 to 9 and 14.

First, an overview of the generation of the diagnostic model will be given using FIG. 14. MFPs 110*a* to 110*c* periodically send event logs to the server. The event log includes the generation date/Lime of the event log, component-by-component sensor values, a usage time, setting values, apparatus-side setting values, and the like, for example.

The apparatus-side setting values include settings pertaining to printing speed, network settings, authentication settings, the operating mode (e.g., whether an anti-condensation mode is on or off), and the like, for example.

The parameters included in the event log are not limited to those mentioned above. For example, the number of prints executed by the MFP 110, the number of times a scanning process has been carried out, the number of rotations of a photosensitive drum or various types of rollers (not shown) in the MFP 110, information such as the model information, and the like may be included in the event log. Additionally, it is not necessary that all of the above-described parameters be included in the event log.

If an error has occurred in the MFP 110, an error code, which is information indicating the type of the error that has occurred, is included in the event log in addition to the above-described parameters. An event log sent in a state where an error has not occurred may be sent without including an error code, or may be sent including information indicating that an error has not occurred.

The server apparatus 120 clusters (classifies) the event logs collected from the MFPs 110*a* to 110*c* on the basis of whether or not an error code is present and the type of the error code.

The server apparatus 120 analyzes the clustering result and associates the details of the log with the errors that occur. For example, if the analysis indicates that a combination of a sensor value from a component A and a sensor value from a component B is a predetermined combination, it can be detected that there is a high likelihood that an error having an error code of 10 will occur. Additionally, if the sensor value of the component A has transitioned in a predetermined manner in time series (e.g., the sensor value has risen by a predetermined amount within a predetermined period), it can be detected that there is a high likelihood that an error having an error code of 15 will occur. Furthermore, the details of the log may be associated with the error type while taking into consideration the state of the setting values in the above-described example. For example, an association indicating that, in a case where the setting value of the component A is within a predetermined range, an error having the error code of 15 may be made if the sensor value rises by a predetermined amount within a predetermined period. Additionally, for example, the event log and the error type may be associated while taking into consideration the state of the operating mode. For example, if the anti-condensation mode is on (active) and the total operating time of the fan within the MFP 110 is greater than or equal to a predetermined amount of time, an association may be made indicating that a specific error is likely to occur in the fan.

In this manner, the server apparatus 120 can create a diagnostic model in which the details of the event logs are associated with the error types. Hereinafter, the above-described clustering process in the process of associating the log details with the error types may be called the "learning process".

FIG. 7 is a flowchart illustrating the sequence of the diagnostic model generation process according to the present embodiment. The diagnostic model generation process is carried out using the information received from the MFP 110 over the network 100. The processes of the steps illustrated in FIG. 7 can be realized, in the server apparatus 120, by the CPU 401 reading out and executing a program of the model generation service 600 stored in HDD 404.

In step S701, the event log receiving unit 601 collects the information from the client apparatus (the MFP 110). Specifically, the event log receiving unit 601 stands by to receive the event log from the MFP 110, and upon receiving the event log, instructs the MFP information management unit 602 and the event log management unit 604 to save the information. Once the information has been successfully saved in the MFP information DB 603 and the event log DB 605, the event log receiving unit 601 advances the process to step S702.

In step S702, the learning control unit 606 determines whether or not to start executing the learning process. This determination is made in accordance with the above-described references for determining whether or not to execute the learning process. For example, a determination to start executing the learning process can be made each time an event log including the malfunction information (the error information) is received from the MFP 110 (each time the event log is registered in the event log DB 605). Additionally, the determination to start executing the learning process can be made if a predetermined amount of time has passed following the previous diagnostic model update. If it has been determined to start executing the learning process, the learning control unit 606 notifies the filtering unit 607 and advances the process to step S703, whereas if it has been determined that the execution of the learning process is not to be started, the learning control unit 606 returns the process to step S701 and again stands by for an event log to be received.

In step S703, the filtering unit 607 and the learning data generating unit 609 execute the filtering process according to the sequence illustrated in FIG. 8. In the present embodiment, the filtering unit 607 and the learning data generating unit 609 carry out, for the event logs received from each information processing apparatus (MFP 110), the filtering process for collecting the dynamic information (time series information) and the error information. Once the filtering process is complete, the filtering unit 607 notifies the learning control unit 606 that the filtering process is complete. In response to the notification from the filtering unit 607, the learning control unit 606 instructs the learning processing unit 611 to start executing the learning process. In response to the instruction from the learning control unit 606, the learning processing unit 611 executes the learning process according to the sequence illustrated in FIG. 9 in step S704. Once the learning process is complete, the learning processing unit 611 notifies the diagnostic model management unit 612 that the learning process is complete, and advances the processing to step S705.

In step S705, the diagnostic model management unit 612 stores (registers) the diagnostic model, which is a trained model for diagnosing a malfunction in the MFP 110 and is obtained as a result of the learning process, in the diagnostic model DB 613, along with the filtering conditions used by the filtering unit 607. Upon storing the new diagnostic model and filtering conditions in the diagnostic model DB 613, the diagnostic model management unit 612 notifies the diagnostic model delivery unit 614 of the diagnostic model and the filtering conditions.

On the basis of the notified diagnostic model and filtering conditions, the diagnostic model delivery unit 614 delivers (sends) the diagnostic model over the network 100 to the client apparatus (the MFP 110) that satisfies the filtering conditions. The delivery of the diagnostic model to the client apparatus may be carried out autonomously by the server apparatus 120, or may be carried out as a response to the diagnostic model obtainment request from the client apparatus.

Once the output (sending to the client apparatus) of the diagnostic model generated by the learning process in step S705 is completed in this manner, the processing in accordance with the sequence illustrated in FIG. 7 ends.

(Filtering Process by Server Apparatus)

FIG. 8 is a flowchart illustrating the sequence of the filtering process executed in step S703 of FIG. 7. The processes of the steps illustrated in FIG. 8 are executed by the filtering unit 607 and the learning data generating unit 609 in response to instructions from the learning control unit 606.

In step S801, the filtering unit 607 determines the filtering conditions for generating the learning data. The filtering conditions may include the number of pieces of learning data to be generated. The filtering unit 607 outputs the determined filtering conditions to the learning data generating unit 609 and advances the process to step S802.

In step S802, the learning data generating unit 609 determines whether or not learning data that satisfies the filtering conditions has already been collected. The learning data generating unit 609 advances the process to step S803 if it is determined that learning data satisfying the filtering conditions has not yet been collected, and ends the process if it is determined that such learning data has already been collected.

In step S803, the learning data generating unit 609 obtains the static information of the MFP 110 from the MFP information DB 603 on the basis of the filtering conditions, and then advances the process to step S804. In step S803, the static information satisfying the filtering conditions is obtained. In step S804, the learning data generating unit 609 obtains one or more event logs from the event log DB 605 on the basis of the filtering conditions, and then advances the process to step S805. In step S804, an event log satisfying the filtering conditions is obtained.

In step S805, the learning data generating unit 609 collects (obtains), from the plurality of event logs received in order from the MFPs 110 in step S804, information that indicates the settings and states of those MFPs, and that has the same attributes, as the dynamic information (time series information). For example, the learning data generating unit 609 arranges the plurality of event logs in time series, collects the sensor values, corresponding to a specific sensor, included in each of the event logs, and obtains the collected time-series sensor values as the dynamic information.

Then, in step S806, the learning data generating unit 609 registers the data corresponding to the combined information obtained in steps S803 to S805 (the static information and the dynamic information) in the learning data DB 610 as the learning data, and returns the process to step S802. Note that the learning data generating unit 609 can register the information obtained in steps S803 to S805 in the corresponding learning data stored in the learning data DB 610 each time a piece of the information is obtained.

(Learning Process by Server Apparatus)

FIG. 9 is a flowchart illustrating the sequence of the learning process executed in step S704 of FIG. 7. The processes of the steps illustrated in FIG. 9 are executed by the learning processing unit 611 in response to instructions from the learning control unit 606.

In step S901, the learning processing unit 611 determines learning conditions, which are the conditions under which the learning process by the learning processing unit 611 ends, on the basis of instructions from the learning control unit 606. For example, a condition that learning is carried out using all the learning data designated by the learning control unit 606 is set as the learning conditions, but other conditions may be set as well.

Next, in step S902, the learning processing unit 611 determines whether or not the learning conditions are satisfied. The learning processing unit 611 advances the process to step S903 if the learning conditions are not satisfied, and ends the learning process if the learning conditions are satisfied.

In step S903, the learning processing unit 611 selects untrained (i.e., not yet used in the learning process) learning data from the learning data designated in the instruction from the learning control unit 606, and advances the process to step S904. In step S904, the learning processing unit 611 generates or updates a diagnostic model, which is a trained model, by carrying out learning using the learning data selected in step S903. Once the learning using the learning data ends, the learning processing unit 611 returns the process to step S902, and repeats the processes of steps S903 and S904 until the learning conditions are satisfied.

The server apparatus 120 can generate the diagnostic model through learning and deliver the generated diagnostic model to the MFP 110, which is a client apparatus, by executing the processing described using FIGS. 7 to 9.

(Malfunction Diagnosis Process by MFP)

Next, an overview of a method through which the MFP 110 employs the diagnostic model generated by the server apparatus 120 will be given using FIG. 15. The MFP 110 obtains the diagnostic model generated by the server apparatus 120. The MFP 110 then compares the obtained diagnostic model with the log information in that MFP 110 itself, and then derives the types of malfunction (error) that may arise in the MFP 110 thereafter, the malfunction occurrence possibility, and the like.

The MFP 110 extracts, from patterns of event logs included in the diagnostic model, a pattern that resembles the log information in that MFP 110. The error type associated with the extracted event log pattern is then specified by referring to the diagnostic model.

The MFP 110 can therefore specify the type of malfunction that may arise in that MFP 110 thereafter.

The MFP 110 may furthermore find a degree of similarity between the pattern of the event logs included in the diagnostic model and the pattern of the logs in the MFP 110 itself, and on the basis of that degree of similarity, output the type of the malfunction that may arise in the MFP 110 thereafter and the possibility of the malfunction occurring.

A process for displaying the possibility of a malfunction occurring will be described using FIG. 16. The processes of the steps illustrated in FIG. 16 are realized by the CPU 301 in the MFP 110 reading out and executing a program stored in the HDD 304 or the ROM 302.

FIG. 16 illustrates an example in which component identification information, a change amount in a sensor value per predetermined amount of time, and an error type are written in association with a diagnostic model. Additionally, FIG. 16 illustrates an example in which the MFP 110 finds the malfunction occurrence possibility for each of components 0 to n.

Upon starting of the process for displaying the malfunction occurrence rate, in step S1600, the CPU 301 sets i, which indicates the type of the component, to an initial value. In other words, i is set to 0.

Next, in step S1601, the CPU 301 obtains the change amount (a change amount A) in the sensor value per predetermined amount of time for the component i on the basis of the log in that MFP 110. The change amount may be the difference between a pre-change amount and a post-change amount, or may be obtained as a percentage (a change rate).

Next, in step S1602, the CPU 301 refers to the diagnostic model and obtains a change amount (a change amount B) in the sensor value per predetermined amount of time associated with the component i. Note that to simplify the descriptions, the present embodiment describes an example in which only a single change amount and a single error type are associated with a single component, but the embodiment is not limited thereto. A configuration is also possible in which a plurality of change amounts are associated with a single component, and error types are associated with the respective change amounts. If a single component is associated with a plurality of change amounts, the CPU 301 repeats the processing from step S1602 to S1606 for each change amount.

Next, in step S1603, the CPU 301 determines whether a difference between the change amount A obtained in step S1601 and the change amount B obtained in step S1602 is within a predetermined range. If the difference is not within the predetermined range ("NO" in step S1603), the CPU 301 determines that there is no possibility of an error occurring, and advances the process to step S1608.

On the other hand, if the difference between the change amount A and the change amount B is within the predetermined range ("YES" in step S1603), in step S1604, the CPU 301 obtains the error code of the error associated with the change amount B obtained in step S1602.

Once the error code is obtained in step S1604, in step S1605, the CPU 301 obtains the malfunction occurrence possibility corresponding to the difference between the change amount A and the change amount B. For example, differences and malfunction occurrence possibilities can be associated with each other in advance and stored in the HDD 304 or the ROM 302. The CPU 301 can obtain the malfunction occurrence possibility associated with the difference obtained in step S1603 from the HDD 304 or the ROM 302.

Regarding the relationship between the malfunction occurrence possibility and the difference, if, for example, the difference is 0, the malfunction occurrence possibility can be set to from 90% to 100% or the like. If the difference is from 1 to 5, the malfunction occurrence possibility can be set to from 80% to 90% or the like. In this manner, the malfunction occurrence possibility can be determined to be higher as the difference decreases.

Next, in step S1606, the CPU 301 associates the error code obtained in step S1604, the malfunction occurrence possibility obtained in step S1605, and the identification information of the component i, and stores them in the RAM 303.

Then, in step S1607, the CPU 301 determines whether the processing from steps S1601 to S1606 are complete for all of the components subject to the determination. For example, it is determined that the processing is complete for all of the components subject to the determination if i=n. If the processing is not complete for all of the components ("NO" in step S1607), the CPU 301 advances the process to step S1608, increments the value of i, and returns to step S1601. On the other hand, if the processing is complete for all of the components, in step S1609, the CPU 301 displays the details stored in the RAM 303 in step S1606 in the display unit of the operation unit 206, and then ends the processing.

The malfunction diagnosis process executed by the MFP 110 will be described next with reference to FIG. 10. FIG. 10 is a flowchart illustrating the sequence of the malfunction diagnosis process according to the present embodiment. In the present embodiment, the MFP 110 obtains the diagnostic model from the server apparatus 120 over the network 100, and executes a malfunction diagnosis in that MFP 110 itself using the obtained diagnostic model. The processes of the steps in FIG. 10 can be realized by the CPU 301 in the MFP 110 reading out and executing a program of the MFP firmware 500 stored in a storage device such as the ROM 302 or the HDD 304.

In step S1001, upon receiving a notification from the buffer notification unit 510, the diagnosis control unit 515 determines whether or not to execute the malfunction diagnosis on the basis of details in the event log pertaining to the received notification. The condition for determining to execute the malfunction diagnosis is, for example, reception of a notification pertaining to a specific event log, or a predetermined amount of time having passed from the previous malfunction diagnosis at the point in time when a notification pertaining to an event log is received. Alternatively the condition may be reception of an instruction to execute the malfunction diagnosis from the user.

If it is determined that a malfunction is to be diagnosed, the diagnosis control unit 515 outputs an instruction to the diagnostic model management unit 516 and advances the process from step S1001 to step S1002, whereas if it is determined that a malfunction is not to be diagnosed, ends the process.

In step S1002, the diagnostic model management unit 516 determines whether or not it is necessary to update the diagnostic model saved in the diagnostic model DB 519. The condition for determining that it is necessary to update the diagnostic model is, for example, a notification that a change (update) to the diagnostic model in the server apparatus 120 has been made in the server apparatus 120. If the diagnostic model management unit 516 determines that it is necessary to update the diagnostic model, it advances the process to step S1003. On the other hand, if the diagnostic model management unit 516 determines that it is not necessary to update the diagnostic model, it reads out the diagnostic model to be used for the malfunction diagnosis from the diagnostic model DB 519 and outputs it to the diagnosis control unit 515, and thereafter advances the process to step S1004.

In step S1003, the diagnostic model management unit 516 obtains the diagnostic model for that MFP 110 from the server apparatus 120 by communicating with the server apparatus 120 via the server communication unit 512. Note that the diagnostic model management unit 516 saves the diagnostic model obtained from the server apparatus 120 in the diagnostic model DB 519 and also outputs that diagnostic model to the diagnosis control unit 515, after which the process moves to step S1004.

In step S1004, the diagnosis control unit 515 instructs the information collection unit 514 to collect the information (the malfunction diagnosis information) necessary for the malfunction diagnosis using the diagnostic model. The information collection unit 514 collects the malfunction diagnosis information in the MFP 110 in response to the instruction from the diagnosis control unit 515, and outputs the collected information to the diagnosis control unit 515. The malfunction diagnosis information is collected from the buffer DB 509 or the setting value DB (not shown), for example.

Next, in step S1005, the diagnosis control unit 515 determines whether or not the malfunction diagnosis information has been successfully collected, and advances the process to step S1006 if the information has been successfully collected, and ends the process if the information has not been successfully collected.

In step S1006, the diagnosis processing unit 518 executes the malfunction diagnosis for that MFP 110 as described using FIG. 16, on the basis of the diagnostic model output from the diagnostic model management unit 516 and the information collected in step S1004. Specifically, the diagnosis processing unit 518 executes the malfunction diagnosis by inputting the collected information to the diagnostic model as the input parameters and obtaining the output parameters output from the diagnostic model as the malfunction diagnosis result. The diagnosis processing unit 518 outputs, to the diagnosis result notification unit 517, the output parameters obtained as the result of the malfunction diagnosis, and then advances the process to step S1007.

In step S1007, the diagnosis result notification unit 517 determines whether or not a notification condition for making a notification of the diagnosis result has been satisfied on the basis of the diagnosis result output from the diagnosis processing unit 518. The notification condition is, for example, that the likelihood of a specific error (malfunction) occurring has exceeded a predetermined threshold, the likelihood of the specific error occurring is in an increasing trend, or the like. The diagnosis result notification unit 517 ends the process without making the diagnosis result notification if the notification condition is not satisfied, and advances the process to step S1008 if the notification condition is satisfied.

In step S1008, the diagnosis result notification unit 517 makes the notification of the diagnosis result, and ends the process. The notification of the diagnosis result may be made to the user of the MFP 110, or to an administrator managing the MFP 110. The notification to the user may be made using the operation unit 206, as illustrated in FIGS. 13B and 13C. The notification to the administrator may be made using a communication method such as sending an email. The diagnosis result notification unit 517 may send the diagnosis result to the server apparatus 120 as an event log.

As described thus far, according to the present embodiment, the server apparatus 120 collects, from a plurality of MFPs including the MFP 110, the time series information indicating changes over time in the settings and states of the MFPs, as well as error information indicating errors that have occurred in the MFPs. The server apparatus 120 generates the diagnostic model, which is a trained model for a malfunction diagnosis in the MFP 110, by generating the learning data including the collected information and carrying out learning on the basis of the generated learning data. MFP 110 obtains the diagnostic model generated by the server apparatus 120 from that server apparatus 120. Furthermore, by collecting the information necessary for the malfunction diagnosis within the MFP 110 and then executing the malfunction diagnosis using the collected information and the diagnostic model obtained from the server apparatus 120, the MFP 110 outputs a diagnosis result indicating the likelihood of an error occurring in the MFP 110.

In this manner, the diagnostic model generated by the server apparatus 120, through learning on the basis of the information collected from the plurality of MFPs including the MFP 110, is provided to the MFP 110. The MFP 110 can realize a more accurate malfunction diagnosis by executing the malfunction diagnosis using the diagnostic model provided from the server apparatus 120. Additionally, an indication that a malfunction (error) will occur in the MFP 110 can be detected before the error occurs.

Although the present embodiment describes an example in which the generation or updating of the diagnostic model and the malfunction diagnosis using the diagnostic model are carried out through learning using a neural network, the processes can also be carried out through learning using another method instead.

Second Embodiment

The first embodiment describes an example in which the server apparatus 120 generates a diagnostic model on the basis of information collected from the MFP 110, and the MFP 110 obtains that diagnostic model from the server apparatus 120 and executes malfunction diagnosis in the MFP 110 using the obtained diagnostic model. As long as a certain amount of information on the MFP 110 can be collected, the server apparatus 120 can generate the learning data using the collected information, and generate the diagnostic model. However, if the server apparatus 120 has collected a sufficient amount of information, such as event logs, which includes error occurrence information, it is possible to specify specific conditions as the filtering conditions used when generating the diagnostic model, and to generate a diagnostic model satisfying those conditions.

Accordingly, the second embodiment will describe an example in which conditions such as the specific model of the MFP, specific parts, and the error type are designated as the above-described filtering conditions, a diagnostic model satisfying those conditions is generated, and a malfunction in the MFP 110 is diagnosed using the generated diagnostic model. In the following, descriptions of parts that are the same as in the first embodiment will be omitted, and only parts that are different will be described.

(Attribute Information)

The server apparatus 120 according to the second embodiment manages the generated diagnostic model in association with attribute information of that diagnostic model. This attribute information corresponds to the filtering conditions used in generation of the diagnostic model, and includes the following information, for example:

model information;
parts information;
error information; and
diagnosis timing information.

The model information is information pertaining to the model of the MFP, and is information indicating the specific model of the MFP, information indicating whether the MFP is one for black-and-white or color, information indicating the paper sizes that the MFP can handle, or information indicating the region where the MFP is operated. The attribute information corresponding to a diagnostic model dependent on the model of the MFP includes the model information. The attribute information corresponding to a diagnostic model independent from the model of the MFP does not include the model information.

The parts information is information indicating parts of the MFP subject to the malfunction diagnosis. The attribute information corresponding to a diagnostic model dependent on the parts of the MFP includes the parts information. The attribute information corresponding to a diagnostic model independent from the parts of the MFP does not include the parts information.

The error information is information indicating a specific error type in the MFP. The attribute information corresponding to a diagnostic model for a specific error type includes the error information. The attribute information corresponding to a diagnostic model not for a specific error type does not include the error information. The error information may be information indicating the type of an error that has occurred, included in an event log registered in the buffer DB 509 within the MFP 110. Alternatively, the error information may be information having a structure that makes it possible to identify where in the MFP 110 an error has occurred, and may include a UUID for uniquely identifying the details of the error.

The diagnosis timing information is information for setting the timing at which the malfunction diagnosis is to be executed using the corresponding diagnostic model, and in the present embodiment, includes the type of an event to be registered in the buffer DB 509 as an event log. In other words, the timing at which an event of the type included in the diagnosis timing information has occurred (the timing at which the event log of the event has been registered) is set as the timing for executing the malfunction diagnosis using the corresponding diagnostic model.

(Functional Configuration of Server Apparatus)

The server apparatus 120 according to the present embodiment has the same functional configuration as in the first embodiment (see FIG. 6). The following will describe operations of the function units according to the present embodiment, carried out in a case where using the attribute information in addition to the diagnostic model is used.

The learning control unit 606 holds the filtering conditions to be provided to the filtering unit 607, and generates from these filtering conditions, the attribute information of the diagnostic model. When instructing the learning processing unit 611 to execute the learning process, the learning control unit 606 includes in the execution instruction a learning data designation as well as the attribute information, so as to notify the learning processing unit 611 of the learning data and attribute information to be used in the learning process.

If the learning process is completed and the generated diagnostic model is output to the diagnostic model management unit 612, the learning processing unit 611 also outputs the attribute information for which the learning control unit 606 made the notification. The diagnostic model management unit 612 registers (stores) the diagnostic model and the attribute information output from the learning processing unit 611 in the diagnostic model DB 613 in association with each other. At this time, if a diagnostic model having the same attribute information as the attribute information associated with the diagnostic model being registered is already registered in the diagnostic model DB 613, the diagnostic model management unit 612 may overwrite the already-registered diagnostic model. Alternatively, the diagnostic model management unit 612 may add a timestamp to the diagnostic model to be registered as the attribute information and then register the diagnostic model, which has the timestamp as the attribute information, in the diagnostic model DB 613.

If the attribute information is designated in the diagnostic model obtainment request from the diagnostic model delivery unit 614, the diagnostic model management unit 612 obtains a diagnostic model having the designated attribute information from the diagnostic model DB 613. Furthermore, the diagnostic model management unit 612 outputs the obtained diagnostic model, along with the attribute information, to the diagnostic model delivery unit 614. In an obtainment request, rather than designating the entirety of the attribute information, it is possible to designate only some of the information, such as information indicating the model or parts. In this case, the diagnostic model management unit 612 outputs, as a response to the obtainment request, a diagnostic model corresponding to the attribute information that includes the designated information as a part of the attribute information. If a timestamp is designated as the attribute information in the diagnostic model, the diagnostic model management unit 612 outputs, as a response, a diagnostic model having a timestamp coming after the designated timestamp.

When receiving the diagnostic model obtainment request from the MFP 110, the diagnostic model delivery unit 614 also receives a designation of the attribute information along with the obtainment request. The designation of the attribute information may be received as included in the obtainment request. The diagnostic model delivery unit 614 notifies the diagnostic model management unit 612 of the received obtainment request and the attribute information, and obtains the diagnostic model having the notified attribute information from the diagnostic model management unit 612. The diagnostic model delivery unit 614 sends the diagnostic model and attribute information obtained from the diagnostic model management unit 612 to the MFP 110 as a response to the obtainment request.

(Functional Configuration of MFP)

The MFP 110 according to the present embodiment has the same functional configuration as in the first embodiment (see FIG. 5). The following will describe operations of the function units according to the present embodiment, carried out in a case where the attribute information in addition to the diagnostic model is used.

The diagnostic model management unit 516 stores and manages the diagnostic model obtained from the server apparatus 120 in the diagnostic model DB 519 in association with the attribute information. Additionally, the diagnostic model management unit 516 can designate the attribute information when sending the diagnostic model obtainment request to the server apparatus 120 via the server communication unit 512. At that time, the diagnostic model received from the server apparatus 120 is stored in the diagnostic model DB 519 in association with the attribute information. Note that one or more of the model information, the parts information, the error information, and the diagnosis timing information can be designated as the attribute information, for example. Additionally, the diagnostic model management unit 516 may accept a designation for attribute information from another function unit.

Upon receiving a notification from the buffer notification unit 510, the diagnosis control unit 515 obtains the details of the event log pertaining to the received notification. The diagnosis control unit 515 makes a request to the diagnostic model management unit 516 for the diagnostic model pertaining to an event of the type indicated by the event log (i.e., the diagnostic model that includes, in the corresponding diagnosis timing information, the event type indicated by the event log). As a result, the diagnosis control unit 515 obtains one or more diagnostic models for malfunction diagnosis based on the occurrence of an event of the type indicated by the event log.

The diagnosis control unit 515 selects one or more of the diagnostic models obtained from the diagnostic model management unit 516 in order, and instructs the information collection unit 514 to collect the information that will be necessary to diagnose a malfunction using the selected diagnostic model. Furthermore, the diagnosis control unit 515 instructs the diagnosis processing unit 518 to execute a malfunction diagnosis on the basis of the selected diagnostic model and the malfunction diagnosis information collected by the information collection unit 514.

(Diagnostic Model Generation Process by Server Apparatus)

The diagnostic model generation process executed by the server apparatus 120 will be described next with reference to FIG. 11. FIG. 11 is a flowchart illustrating the sequence of the diagnostic model generation process according to the present embodiment. The diagnostic model generation process is carried out using the information received from the MFP 110 over the network 100. The processes of the steps illustrated in FIG. 11 can be realized, in the server apparatus 120, by the CPU 401 reading out and executing a program of the model generation service 600 stored in HDD 404.

In step S701, the event log receiving unit 601 carries out the same processing as in the first embodiment, and advances the process to step S1101.

In step S1101, the learning control unit 606 determines the attribute information on the basis of the event log received by the event log receiving unit 601, and then advances the process to step S1102. In step S1102, the learning control unit 606 determines whether or not to start executing the learning process on the basis of the attribute information determined in step S1101. If it has been determined to start executing the learning process, the learning control unit 606 notifies the filtering unit 607 and advances the process to step S703, whereas if it has been determined that the execution of the learning process is not to be started, the learning control unit 606 returns the process to step S701 and again stands by for an event log to be received.

In steps S703 and S704, the filtering unit 607 and the learning processing unit 611 carry out the same processing as in the first embodiment. Once the process of step S704 ends, the learning processing unit 611 advances the process to step S1103.

In step S1103, the diagnostic model management unit 612 stores (registers) the diagnostic model obtained as a result of the learning process in the diagnostic model DB 613 in association with the attribute information obtained in step S1101, and then ends the processing.

According to the processing described above, the learning process for generating a diagnostic model can be carried out for each instance of attribute information, and the generated diagnostic model and the attribute information can be saved in association with each other.

(Malfunction Diagnosis Process by MFP)

The malfunction diagnosis process executed by the MFP 110 will be described next with reference to FIG. 12. FIG. 12 is a flowchart illustrating the sequence of the malfunction diagnosis process according to the present embodiment. In the present embodiment, the MFP 110 designates the attribute information, obtains the diagnostic model from the server apparatus 120, and diagnoses a malfunction in that MFP 110 itself using the diagnostic model corresponding to the designated attribute information. The processes of the steps in FIG. 12 can be realized by the CPU 301 in the MFP 110 loading a program of the MFP firmware 500, stored in a storage device such as the ROM 302 or the HDD 304, into the RAM 303, and executing the program.

In step S1201, upon receiving a notification from the buffer notification unit 510, the diagnosis control unit 515 determines whether or not to execute the malfunction diagnosis on the basis of details in the event log pertaining to the received notification. Specifically, the diagnosis control unit 515 makes a request to the diagnostic model management unit 516 for the diagnostic model with which the event type indicated by the event log is associated as the diagnosis timing information. If one or more diagnostic models have been successfully obtained from the diagnostic model management unit 516, the diagnosis control unit 515 advances the process to step S1202 to execute the malfunction diagnosis. On the other hand, if such a diagnostic model has not been successfully obtained from the diagnostic model management unit 516, the diagnosis control unit 515 ends the process without executing the malfunction diagnosis.

In step S1202, the diagnosis control unit 515 selects one unselected diagnostic model from the one or more diagnostic models obtained in step S1201, outputs the selected diagnostic model and the corresponding attribute information to the diagnostic model management unit 516, and advances the process to step S1002.

In step S1002, the diagnostic model management unit 516 determines whether or not it is necessary to update the diagnostic model in the same manner as in the first embodiment, and if it is determined that it is necessary to update the diagnostic model, it advances the process to step S1203, and if it is determined that it is not necessary to update the diagnostic model, it advances the process to step S1004.

In step S1203, the diagnostic model management unit 516 designates the attribute information corresponding to the diagnostic model to be updated, and obtains the diagnostic model for that MFP 110 itself from the server apparatus 120. The diagnostic model management unit 516 saves the diagnostic model obtained from the server apparatus 120 in the diagnostic model DB 519 in association with the attribute information, and advances the process to step S1004.

The same processing as that described in the first embodiment is carried out in steps S1004 to S1008. However, the process is advanced to step S1204 if the malfunction diagnosis information could not be successfully collected in step S1005, if the diagnosis result notification condition is not satisfied in step S1007, or if the diagnosis result notification in step S1008 is complete.

In step S1204, the diagnosis control unit 515 determines whether or not the selection in step S1202 is complete for all of the one or more diagnostic models obtained in step S1201. The diagnosis control unit 515 returns the process to step S1202 if an unselected diagnostic model remains, and ends the process if the selection is complete for all the diagnostic models.

According to the present embodiment as described thus far, the server apparatus 120 saves attribute information, which corresponds to the filtering conditions used in the filtering process for generating the learning data, in association with the generated diagnostic model. By sending the diagnostic model obtainment request, which includes a designation of the attribute information, to the server apparatus 120, the MFP 110 obtains a diagnostic model corresponding to the attribute information designated in the obtainment request from the server apparatus 120, and executes the malfunction diagnosis using the obtained diagnostic model.

In this manner, the MFP 110 can execute the malfunction diagnosis using a malfunction diagnostic model for each instance of attribute information, and thus the accuracy of the malfunction diagnosis corresponding to specific attribute information can be improved. Additionally, multiple malfunctions can be diagnosed by using multiple diagnostic models.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-103669, filed May 30, 2018 and Japanese Patent Application No. 2019-088575, filed May 8, 2019, which are hereby incorporated by reference herein in their entirety.

The invention claimed is:

1. An information processing system comprising a server apparatus, which is capable of electronically communicating with a plurality of image processing apparatuses, and at least one image processing apparatus, the server apparatus comprising:
one or more first controllers having at least one memory that stores first instructions and at least one processor that executes the first instructions to perform:
collecting, from the plurality of image processing apparatuses via electronic communication, error event logs including at least state information and timing information, obtaining time series information related to the state information based on the collected error event logs, and generating learning data including at least the time series information; and
causing a diagnostic model to machine learn by using the learning data, the diagnostic model being a trained model for a malfunction diagnosis, and
the at least one image processing apparatus comprising:
a display device configured to display information; and
one or more second controllers having at least one memory that stores second instructions and at least one processor that executes the second instructions to perform:
obtaining, from the server apparatus via electronic communication, the diagnostic model learned on the server apparatus;
inputting at least time series information related to current state information of the at least one image processing apparatus to the obtained diagnostic model, and obtain a diagnosis result indicating a likelihood that an error will occur in the at least one image processing apparatus from the obtained diagnostic model, and
causing the display device to display diagnosis information based on the diagnosis result.

2. The information processing system according to claim 1,
wherein the at least one processor of the one or more second controllers executes the second instructions to further perform sending, to the server apparatus, an error event log pertaining to an error event that has occurred in the at least one image processing apparatus.

3. The information processing system according to claim 1,
wherein the at least one processor of the one or more first controllers executes the first instructions to further perform executing a filtering process to collect same attribute information from the collected error event logs.

4. The information processing system according to claim 3,
wherein in the filtering process, time series sensor values corresponding to a specific sensor in each image processing apparatus are collected, from a plurality of error event logs received in order from that image processing apparatus, as the time series information indicating a change over time in the state of that image processing apparatus.

5. The information processing system according to claim 3,
wherein the at least one processor of the one or more first controllers executes the first instructions to further perform saving attribute information, corresponding to a filtering condition used in the filtering process in association with the generated diagnostic model; and
the at least one processor of the one or more second controllers executes the second instructions to further perform, by sending, to the server apparatus, a diagnostic model obtainment request including a designation of attribute information, obtaining, from the server apparatus, a diagnostic model corresponding to the attribute information designated in the obtainment request.

6. The information processing system according to claim 5,
wherein the attribute information includes at least one of information indicating a model of the at least one image processing apparatus, information indicating a part in the at least one image processing apparatus, information indicating an error type in the at least one image processing apparatus, and information indicating a type of event occurring in the at least one image processing apparatus.

7. The information processing system according to claim 1,
wherein the at least one processor of the one or more first controllers executes the first instructions to further perform updating the diagnostic model by carrying out the learning on the basis of the generated learning data, each time an error event log is received from one of the plurality of image processing apparatuses.

8. The information processing system according to claim 1,
wherein the at least one processor of the one or more first controllers executes the first instructions to further perform updating the diagnostic model by carrying out the learning on the basis of the generated learning data, upon a predetermined amount of time having passed following a previous update of the diagnostic model.

9. The information processing system according to claim 1,
wherein the at least one processor of the one or more second controllers executes the second instructions to further perform executing the malfunction diagnosis if an error event log pertaining to a specific event has been produced as the error event log to be sent to the server apparatus.

10. The information processing system according to claim 1,
wherein the at least one processor of the one or more second controllers executes the second instructions to further perform executing the malfunction diagnosis if, when an error event log to be sent to the server apparatus has been produced, a predetermined amount of time has passed following a previous execution of the malfunction diagnosis.

11. The information processing system according to claim 1,
wherein the at least one processor of the one or more second controllers executes the second instructions to further perform executing the malfunction diagnosis upon receiving an instruction to execute the malfunction diagnosis from a user.

12. The information processing system according to claim 1,
wherein the at least one image processing apparatus further comprises a storage that stores the diagnostic model obtained from the server apparatus;
the at least one processor of the one or more first controllers executes the first instructions to further perform notifying the at least one image processing apparatus of an update to the diagnostic model in a case where the diagnostic model has been updated; and
the at least one processor of the one or more second controllers executes the second instructions to further perform, upon being notified of the update to the diagnostic model by the server apparatus, obtaining the updated diagnostic model from the server apparatus in order to update the diagnostic model stored in the storage.

13. The information processing system according to claim 1,
wherein the at least one processor of the one or more second controllers executes the second instructions to further perform notifying a user or an administrator of the at least one image processing apparatus of the diagnosis result in a case where the diagnosis result indicates that there is a possibility that an error will occur in the at least one image processing apparatus.

14. The information processing system according to claim 13,
wherein the at least one processor of the one or more second controllers executes the second instructions to further perform:
outputting a parameter value indicating the likelihood that an error will occur as the diagnosis result for each of error types; and
making the notification in a case where a total value of parameter values corresponding to different error types exceeds a threshold.

15. The information processing system according to claim 13,
wherein the at least one processor of the one or more second controllers executes the second instructions to further perform sending the diagnosis result to the server apparatus as an error event log.

16. The information processing system according to claim 1, wherein the at least one image processing apparatus has an image forming device configured to form an image on a sheet.

17. The information processing system according to claim 1, wherein the at least one image processing apparatus has an image reading device configured to read an image from an original.

18. The information processing system according to claim 1, wherein the trained model is expressed by a structure of a neural network.

19. An image processing apparatus capable of electronically communicating with a server apparatus, the server apparatus being capable of providing a diagnostic model, which is a trained model for a malfunction, by collecting, from a plurality of image processing apparatuses, error event logs including at least state information and timing information, obtaining time series information related to the state information based on the collected error event logs, generating learning data including at least the time series information, and causing the diagnostic model to machine learn by using the learning data, the image processing apparatus comprising:
a display device configured to display information; and
one or more controllers having at least one memory that stores first instructions and at least one processor that executes the first instructions to perform:
obtaining, from the server apparatus via electronic communication, the diagnostic model learned on the server apparatus;
inputting at least time series information related to current state information of the image processing apparatus to the obtained diagnostic model and obtain a diagnosis result indicating a likelihood that an error will occur in the image processing apparatus; and
causing the display device to display diagnosis information based on the diagnosis result.

20. A non-transitory computer-readable storage medium storing a computer program for causing a computer to execute a control method of an image processing apparatus capable of electronically communicating with a server apparatus and having a display device configured to display information, the server apparatus being capable of providing a diagnostic model, which is a trained model for a malfunction diagnosis, by collecting, from a plurality of image processing apparatuses, error event logs including at least state information and timing information, obtaining time series information related to the state information based on the collected error event logs, generating learning data including at least the time series information, and causing the diagnostic model to machine learn by using the learning data, the control method comprising:
obtaining, from the server apparatus via electronic communication, the diagnostic model learned on the server apparatus;
inputting at least time series information related to current state information of the image processing apparatus to the obtained diagnostic model, and obtaining a diagnosis result indicating a likelihood that an error will occur in the image processing apparatus from the obtained diagnostic model; and
causing the display device to display diagnosis information based on the diagnosis result.

* * * * *